United States Patent
Kato et al.

(10) Patent No.: US 6,584,005 B1
(45) Date of Patent: Jun. 24, 2003

(54) SEMICONDUCTOR MEMORY DEVICE PREVENTING ERRONEOUS WRITING IN WRITE OPERATION AND DELAY IN READ OPERATION

(75) Inventors: Hiroshi Kato, Hyogo (JP); Masatoshi Ishikawa, Hyogo (JP); Tsukasa Ooishi, Hyogo (JP); Jun Ohtani, Hyogo (JP); Hideto Hidaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/302,963

(22) Filed: Nov. 25, 2002

(30) Foreign Application Priority Data

May 24, 2002 (JP) ........................................ 2002-151352

(51) Int. Cl.$^7$ ................................................. G11C 5/06
(52) U.S. Cl. ................. 365/63; 365/189.01; 365/230.06
(58) Field of Search ............................. 365/63, 189.01, 365/230.06

(56) References Cited

U.S. PATENT DOCUMENTS

| | | | |
|---|---|---|---|
| 5,383,160 A | * 1/1995 | Furuyama | 365/221 |
| 5,768,192 A | 6/1998 | Eitan | 365/185.24 |
| 6,011,725 A | 1/2000 | Eitan | 365/185.33 |
| 6,081,456 A | 6/2000 | Dadashev | 365/185.23 |
| 6,134,157 A | * 10/2000 | Takeuchi | 365/200 |
| 6,496,418 B2 | * 12/2002 | Kawahara et al. | 365/185.24 |

OTHER PUBLICATIONS

Boaz Eitan et al., "Can NROM, a 2–bit, Trapping Storage NVM Cell, Give a Real Challenge to Floating Gate Cells?", the International Conference on Solid State devices and Materials, Tokyo, 1999, pp. 1/3–3/3.

* cited by examiner

Primary Examiner—Richard Elms
Assistant Examiner—Tuan T. Nguyen
(74) Attorney, Agent, or Firm—McDermott, Will & Emery

(57) ABSTRACT

In write operation and read operation, a plurality of bit lines are divided into first and second bit line groups based on a selected memory cell column in a memory array. The first bit line group is connected to one of first and second voltages and the second bit line group is connected to the other voltage. Accordingly, when a word line corresponding to a selected memory cell is activated, the sources and drains of the non-selected memory cells in the selected memory cell row are set to the same voltage level. Therefore, a charging/discharging current resulting from charging and discharging of each bit line is not generated in response to activation of the word line. This prevents erroneous writing to the non-selected memory cells and delay in read operation caused by generation of the charging/discharging current.

15 Claims, 25 Drawing Sheets

FIG.14

| U(D)CA<6:4> | U(D)FL | | | | | | | |
|---|---|---|---|---|---|---|---|---|
| | [0] | [1] | [2] | [3] | [4] | [5] | [6] | [7] |
| 000 | 1 | 1 | 1 | 1 | 1 | 1 | 1 | 1 |
| 001 | 0 | 1 | 1 | 1 | 1 | 1 | 1 | 1 |
| 010 | 0 | 0 | 1 | 1 | 1 | 1 | 1 | 1 |
| 011 | 0 | 0 | 0 | 1 | 1 | 1 | 1 | 1 |
| 100 | 0 | 0 | 0 | 0 | 1 | 1 | 1 | 1 |
| 101 | 0 | 0 | 0 | 0 | 0 | 1 | 1 | 1 |
| 110 | 0 | 0 | 0 | 0 | 0 | 0 | 1 | 1 |
| 111 | 0 | 0 | 0 | 0 | 0 | 0 | 0 | 1 |
| UMBL(DMBL) | [8j] | [8j+1] | [8j+2] | [8j+3] | [8j+4] | [8j+5] | [8j+6] | [8j+7] |

| U(D)CA<9:7> | U(D)FM | | | | | | | | |
|---|---|---|---|---|---|---|---|---|---|
| | [-1] | [0] | [1] | [2] | [3] | [4] | [5] | [6] | [7] |
| 000 | 0 | 1 | 1 | 1 | 1 | 1 | 1 | 1 | 1 |
| 001 | 0 | 0 | 1 | 1 | 1 | 1 | 1 | 1 | 1 |
| 010 | 0 | 0 | 0 | 1 | 1 | 1 | 1 | 1 | 1 |
| 011 | 0 | 0 | 0 | 0 | 1 | 1 | 1 | 1 | 1 |
| 100 | 0 | 0 | 0 | 0 | 0 | 1 | 1 | 1 | 1 |
| 101 | 0 | 0 | 0 | 0 | 0 | 0 | 1 | 1 | 1 |
| 110 | 0 | 0 | 0 | 0 | 0 | 0 | 0 | 1 | 1 |
| 111 | 0 | 0 | 0 | 0 | 0 | 0 | 0 | 0 | 1 |
| UMBL(DMBL) | — | [0:7] | [8:15] | [16:23] | [24:31] | [32:39] | [40:47] | [48:55] | [56:63] |

FIG.21 PRIOR ART

| OPERATION | ACCESSED BIT | S(V) | D(V) | G(V) | B(V) | Vth(V) | STATE OF SELECTED BIT | STATE OF NON-SELECTED BIT |
|---|---|---|---|---|---|---|---|---|
| WRITE | BIT 1 | 0 | 5 | 10 | 0 | – | – | – |
| | BIT 2 | 5 | 0 | 10 | 0 | – | – | – |
| ERASE | BIT 1 | Floating | 10 | 0 | 0 | – | – | – |
| | BIT 2 | 10 | Floating | 0 | 0 | – | – | – |
| READ | BIT 1 | 2 | 0 | 3 | 0 | 1 | 1(NO CHARGE TRAPPED IN BIT 1) | 1(NO CHARGE TRAPPED IN BIT 2) |
| | | | | | | 1.1 | 1(NO CHARGE TRAPPED IN BIT 1) | 0(CHARGES TRAPPED IN BIT 2) |
| | | | | | | 4 | 0(CHARGES TRAPPED IN BIT 1) | 1(NO CHARGE TRAPPED IN BIT 2) |
| | | | | | | 4.2 | 0(CHARGES TRAPPED IN BIT 1) | 0(CHARGES TRAPPED IN BIT 2) |
| | BIT 2 | 0 | 2 | 3 | 0 | 1 | 1(NO CHARGE TRAPPED IN BIT 2) | 1(NO CHARGE TRAPPED IN BIT 1) |
| | | | | | | 1.1 | 1(NO CHARGE TRAPPED IN BIT 2) | 0(CHARGES TRAPPED IN BIT 1) |
| | | | | | | 4 | 0(CHARGES TRAPPED IN BIT 2) | 1(NO CHARGE TRAPPED IN BIT 1) |
| | | | | | | 4.2 | 0(CHARGES TRAPPED IN BIT 2) | 0(CHARGES TRAPPED IN BIT 1) |

SEMICONDUCTOR MEMORY DEVICE PREVENTING ERRONEOUS WRITING IN WRITE OPERATION AND DELAY IN READ OPERATION

BACKGROUND OF THE INVENTION

1. Field of the Invention

The present invention generally relates to a semiconductor memory device. More particularly, the present invention relates to the circuit structure of a column decoder.

2. Description of the Background Art

Recent mainstream of memory devices is a flash memory (batch-erasable, electrically-rewritable read only memory) which is capable of storing data in a non-volatile manner. Especially, a MONOS (metal oxide nitride oxide silicon)-type memory cell has attracted attention in the field of the flash memory because of reduced costs and smaller area.

The MONOS-type memory cell is different from a floating-gate-type flash memory in that a floating gate formed from polysilicon is replaced with a gate formed from a nitride film capable of trapping charges.

FIG. 19 is a cross-sectional view of the MONOS-type memory cell MC.

Referring to FIG. 19, an oxide film 4, a nitride film 5, an oxide film 6, and a control gate 7 are stacked on a P-type semiconductor substrate 1. Oxide film 4, nitride film 5 and oxide film 6 are insulating films, and control gate 7 is formed from polysilicon. In P-type semiconductor substrate 1, N-channel diffusion regions 2, 3 are formed near the stacked portion in a self-aligned manner.

Bit lines 9 are formed in a layer located above control gate 7 via contact holes 8 electrically coupled to diffusion regions 2, 3. Bit lines 9 are formed from a metal layer. Note that this control gate functions as a word line. In order to reduce the electric resistance value of control gate 7 formed from polysilicon, it is also possible to form a metal layer having a low electric resistance value above control gate 7 so as to electrically couple the metal layer to control gate 7. However, the word line as used in the specification refers to a region of control gate 7 that does not include such a metal layer portion formed above control gate 7.

Memory cell MC thus corresponds to an N-channel field effect transistor formed on P-type semiconductor substrate 1. Such a memory cell MC is also referred to as a transistor cell.

In the structure of FIG. 19, bit lines 9 are formed in a layer located above control gate 7 via contact holes 8. However, diffusion regions 2, 3 may be replaced with bit lines formed from a diffusion layer without using contact holes 8.

FIG. 20 is a cross-sectional view of a memory cell MC# which is different from MONOS-type memory cell MC in FIG. 19.

Memory cell MC# is different from memory cell MC in that nitride film 5 serving as a charge storage layer is replaced with a granular-silicon-embedded oxide film 5# as shown in FIG. 20. Granular-silicon-embedded oxide film 5# contains a plurality of granular silicons. This memory cell MC# enables improvement in data holding characteristics and reduction in variation of threshold value in write operation as compared to memory cell MC in FIG. 19.

FIG. 21 shows a series of relations of applied voltages in write operation, read operation and erase operation of MONOS-type memory cell MC.

FIG. 21 also shows the relation between a bit to be read and a threshold voltage (Vth) of memory cell MC in read operation.

FIG. 22 illustrates write operation of MONOS-type memory cell MC.

Write operation of bit 1 will now be described with reference to FIGS. 21, 22. 0 V is applied to P-type semiconductor substrate 1, 10 V is applied to control gate 7, 5 V is applied to diffusion region 2, and 0 V is applied to diffusion region 3. Of channel electrons accelerated by a steep electric field in diffusion region 2 of the memory cell, high-energy electrons accelerated to a level equal to or higher than the barrier height of the oxide film are trapped in a region of nitride film 5 located on the side of diffusion region 2 (bit 1). Such trapping of the electrons raises the threshold voltage of memory cell MC, whereby this region of nitride film 5 is rendered in a write state for storing data "0". It is herein assumed that bit 1 is "0" when this region of nitride film 5 is in a write state, that is, when electrons are trapped in this region of nitride film 5, and bit 1 is "1" when this region of nitride film 5 is in an erased state, that is, when no data is stored in this region. The following description will be given on the assumption that data in the write state is "0" and data in the erased state is "1".

Hereinafter, write operation of bit 2 will be described.

In this case, the voltages applied to diffusion regions 2, 3 are switched. More specifically, 0 V is applied to diffusion region 2, and 5 V is applied to diffusion region 3, as shown in parenthesis in FIG. 22. In this case, electrons are trapped in a region of nitride film 5 located on the side of diffusion region 3 (bit 2). Such trapping of electrons raises the threshold voltage of memory cell MC, whereby this region of nitride film 5 is rendered in a write state for storing data "0". Accordingly, bit 2 is "0" when this region of nitride film 5 is in the write state, that is, when electrons are trapped in this region, and bit 2 is "1" when this region of nitride film 5 is in the erased state.

This MONOS structure traps electrons in non-covalent bonds (dangling bonds) which are distributed in a dispersive manner within nitride film 5. Using different locations of nitride film 5 (i.e., the regions of nitride film 5 located on the side of diffusion regions 2, 3) as electron trapping regions enables implementation of data storage of 2 bits/cell.

FIG. 23 illustrates read operation of MONOS-type memory cell MC.

First, read operation of bit 1 (the region of nitride film 5 located on the side of diffusion region 2) will be described with reference to FIGS. 21, 23.

0 V is applied to P-type semiconductor substrate 1, 3 V is applied to control gate 7, 0 V is applied to diffusion region 2, and 2 V is applied to diffusion region 3. For example, when the region of nitride film 5 located on the side of diffusion region 2 is in the write state, that is, when electrons are trapped in this region of nitride film 5, memory cell MC is not turned ON due to a high threshold voltage (4 V or 4.2 V). Therefore, no current path is formed from diffusion region 3 to diffusion region 2. As a result, "0" can be read as bit 1. On the other hand, when the region of nitride film 5 located on the side of diffusion region 2 is in the erased state, memory cell MC is turned ON due to a low threshold voltage (1 V or 1.1 V). Therefore, a current path is formed from diffusion region 3 to diffusion region 2. As a result, "1" can be read as bit 1.

Read operation of bit 2 (the region of nitride film 5 located on the side of diffusion region 3) will now be described.

In this case, the voltages applied to diffusion regions 2, 3 are switched. More specifically, 0 V is applied to P-type semiconductor substrate 1, and 3 V is applied to control gate 7. Moreover, as shown in parentheses in FIG. 23, 2 V is applied to diffusion region 2, and 0 V is applied to diffusion region 3. For example, when the region of nitride film 5 located on the side of diffusion region 3 is in the write state, that is, when electrons are trapped in this region of nitride film 5, memory cell MC is not turned ON due to a high threshold voltage (4 V or 4.2 V). Therefore, no current path is formed from diffusion region 2 to diffusion region 3. As a result, "0" can be read as bit 2. On the other hand, when the region of nitride film 5 located on the side of diffusion region 2 is in the erased state, memory cell MC is turned ON due to a low threshold voltage (1 V or 1.1 V). Therefore, a current path is formed from diffusion region 2 to diffusion region 3. As a result, "1" can be read as bit 2.

Accordingly, bits 1, 2 can be read by adjusting the voltages to be applied to diffusion regions 2, 3. In other words, bits 1, 2 can be read according to whether or not a current path is formed between diffusion regions 2, 3. This enables read operation of 2 bits/cell.

FIG. 24 illustrates erase operation of MONOS-type memory cell MC.

First, erase operation of bit 1 (the region of nitride film 5 located on the side of diffusion region 2) will be described.

As shown in FIGS. 21, 24, it is herein assumed that 0 V is applied to P-type semiconductor substrate 1, 0 V is applied to control gate 7, 10 V is applied to diffusion region 2, and diffusion region 3 is rendered in an open state.

In this case, a Fowler-Nordheim current causes electrons trapped in bit 1 (i.e., the region of nitride film 5 located on the side of diffusion region 2) to move into substrate region 1 or diffusion region 2. Electrons are thus removed from the region of nitride film 5 located on the side of diffusion region 2. In this state, memory cell MC has a reduced threshold voltage.

Erase operation of bit 2 (the region of nitride film 5 located on the side of diffusion region 3) will now be described.

b Vis applied to P-type semiconductor substrate 1, and 0 V is applied to control gate 7. Moreover, as shown in parenthesis in FIG. 24, diffusion region 2 is rendered in an open state, and 10 V is applied to diffusion region 3.

In this case, a Fowler-Nordheim current causes electrons trapped in bit 1 (i.e., the region of nitride film 5 located on the side of diffusion region 3) to move into substrate region 1 or diffusion region 3. Electrons are thus removed from the region of nitride film 5 located on the side of diffusion region 3. In this state, memory cell MC has a reduced threshold voltage.

Note that applying 10 V to both diffusion regions 2, 3 enables electrons to be removed from both bits 1, 2. Such erase operation is also possible.

FIG. 25 shows an example of a memory array having the above MONOS-type memory cells MC arranged in rows and columns.

As shown in FIG. 25, two bit lines are provided on both sides of each memory cell column. This structure increases the pitch of memory cell columns, causing increase in area of the memory array.

FIG. 26 is an improved example of the memory array of FIG. 25.

Referring to FIG. 26, two bit lines are provided on both sides of each memory cell column, and each bit line is shared by adjacent two memory cell columns (hereinafter, this structure is sometimes referred to as shared bit-line structure). This structure reduces the pitch of memory cell columns, enabling reduction in area of the memory array.

However, such a shared bit-line structure may cause erroneous writing to non-selected memory cells in write operation.

FIG. 27 is a conceptual diagram illustrating erroneous writing in write operation.

It is now assumed that data is to be written to a selected memory cell located between bit lines S0, S#.

As shown in FIG. 27, bit lines S0, A0 to E0, S#, A# to E# are provided corresponding to memory cell columns. More specifically, bit lines A0 to E0 are provided on the right of bit line S0, and bit lines A# to E# are provided on the left of bit line S#. Word lines WL are provided corresponding to memory cell rows.

In the illustrated example, bit line S0 is electrically coupled to power supply voltage VCC and bit line S# is electrically coupled to ground voltage GND in write operation.

In this case, a write current flows through the selected memory cell through bit lines S0, S#, whereby data is written thereto. However, since the bit lines are electrically coupled to each other through the memory cells of the selected memory cell row, a through current may flow through the non-selected memory cells via the selected memory cell in response to activation of word line WL.

FIG. 28 shows the potential levels of bit lines A0 to E0 in the case where bit line S0 is connected to power supply voltage VCC in write operation.

As shown in FIG. 28, when bit lines A0 to E0 are 0 V, these bit lines A0 to E0 are charged to power supply voltage (5 V) in response to activation of word line WL. In other words, a transient charging current, that is, a through current, flows through the non-selected memory cells of the selected memory cell row. Such a through current may cause erroneous writing to the non-selected memory cells of the selected memory cell row, that is, the memory cells other than the selected memory cell. Hereinafter, such erroneous writing to the non-selected memory cells is sometimes referred to as "write disturb".

The above through current may flow through bit lines A# to E# located on the other side.

FIG. 29 shows the potential levels of bit lines A# to E# in the case where bit line S# is connected to ground voltage GND in write operation.

As shown in FIG. 29, when bit lines A# to E# are 5 V, these bit lines A# to E# are discharged to ground voltage (0 V) in response to activation of word line WL. In other words, a transient discharging current, that is, a through current, flows through the non-selected memory cells of the selected memory cell row. Such a through current may cause "write disturb" in the non-selected memory cells.

As in the write operation, a through current, that is, a transient charging/discharging current, flows in read operation.

FIG. 30 is a conceptual diagram illustrating a through current that flows through non-selected memory cells in read operation.

It is herein assumed that data is to be read from a selected memory cell located between bit lines S0, S#.

In the illustrated example, bit line S0 is connected to a sense amplifier and bit line S# is connected to ground voltage GND. For example, the sense amplifier supplies a voltage of 2 V, and senses data based on the amount of passing current flowing through the bit lines.

FIG. 31 shows the potential levels of bit lines A0 to E0 in the case where bit line S0 is connected to the sense amplifier (2 V) in read operation.

In the example of FIG. 31, bit lines A0 to E0 are 0 V in read operation. Since each bit line is shared by adjacent two memory cell columns, bit lines A0 to E0 are charged from 0 V to 2 V in response to activation of word line WL.

FIG. 32 shows the potential levels of bit lines A# to E# in the case where bit line S# is connected to ground voltage GND in read operation.

In the example of FIG. 32, bit lines A# to E# are 2 V in read operation. Since each bit line is shared by adjacent two memory cell columns, bit lines A# to E# are discharged from 2 V to 0 V in response to activation of word line WL.

FIG. 33 is a timing chart of a through current that flows through the sense amplifier right after read operation is started.

As shown in FIG. 33, accurate read operation cannot be assured during a period from the start of read operation to time t0, that is, a period required for a transient charging/discharging current corresponding to the above through current to disappear. This period (the period required to complete charging/discharging) results in delay in read operation.

SUMMARY OF THE INVENTION

It is an object of the present invention to provide a semiconductor memory device which prevents erroneous writing in write operation and delay in read operation in the case where the structure in which each bit line is shared by adjacent two memory cell columns is employed in order to implement a memory array having a reduced area.

According to one aspect of the present invention, a semiconductor memory device includes a memory array, a plurality of word lines, a plurality of bit lines, and a bit-line control section. The memory array has a plurality of memory cells arranged in rows and columns. The plurality of word lines are provided corresponding to memory cell rows and selectively activated. The plurality of bit lines are provided on both sides of each memory cell column so as to extend in a column direction. Each bit line is shared by adjacent two memory cell columns. Each memory cell of each memory cell row is electrically coupled between adjacent two bit lines. The bit-line control section controls setting of a voltage of the plurality of bit lines in write operation and read operation. The bit-line control section divides the plurality of bit lines into first and second groups based on a selected memory cell column including a selected memory cell. The bit-line control section sets the bit lines of the first group to one of first and second voltages and sets the bit lines of the second group to the other voltage.

In write operation and read operation, the semiconductor memory device of the present invention thus divides the plurality of bit lines into first and second bit line groups based on the selected memory cell column. The semiconductor memory device electrically couples the first bit line group to one of the first and second voltages and electrically couples the second bit line group to the other voltage.

Accordingly, a main advantage of the semiconductor memory device of the present invention is as follows: when a word line corresponding to a selected memory cell is activated, the sources and drains of the non-selected memory cells in the selected memory cell row are set to the same voltage level. Therefore, a charging/discharging current resulting from charging and discharging of each bit line is not generated. This prevents erroneous writing to the non-selected memory cells in write operation. Moreover, the above structure eliminates the need to delay the time to start sensing operation of a sense amplifier in read operation by a prescribed period in view of a charging/discharging current. This enables improvement in read operation speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a decode table of predecode signals UFL0 to UFL7 generated according to an address.

FIG. 15 is a decode table of predecode signals UFM(−1) to UFM7 generated according to an address.

FIG. 21 shows a series of relations of voltage applied in write operation, read operation and erase operation of a MONOS-type memory cell MC.

DESCRIPTION OF THE PREFERRED EMBODIMENTS

Figure 1:
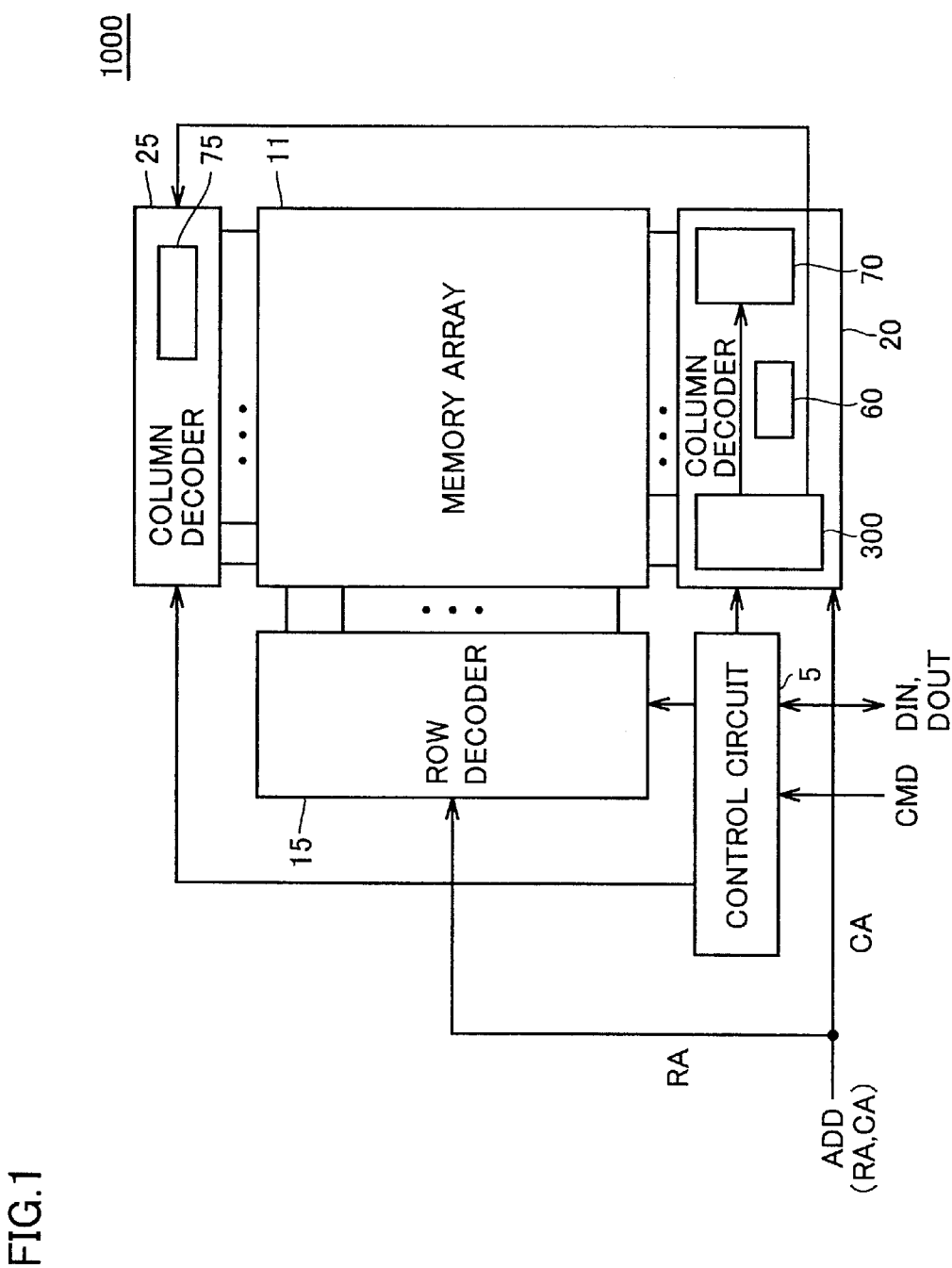
FIG. 1 shows the overall structure of a semiconductor memory device 1000 according to the present invention.

Hereinafter, embodiments of the present invention will be described in detail with reference to the accompanying drawings. Note that the same or corresponding portions are denoted with the same reference numerals and characters throughout the figures, and description thereof will not be repeated.

(First Embodiment)

Referring to FIG. 1, a semiconductor memory device 1000 of the present invention conducts random access in response to an external control signal CMD and an external address signal ADD in order to receive write data DIN and output read data DOUT.

Semiconductor memory device 1000 includes a control circuit 5 for controlling the overall operation of semiconductor memory device 1000 in response to control signal CMD, and a memory array 11 including memory cells MC arranged in a matrix.

Semiconductor memory device 1000 further includes a row decoder 15 for decoding a row address RA indicated by address signal ADD and selecting a row in memory array 11, and column decoders 20, 25 for decoding a column address CA indicated by address signal ADD and selecting a column in memory array 11.

Figure 2:
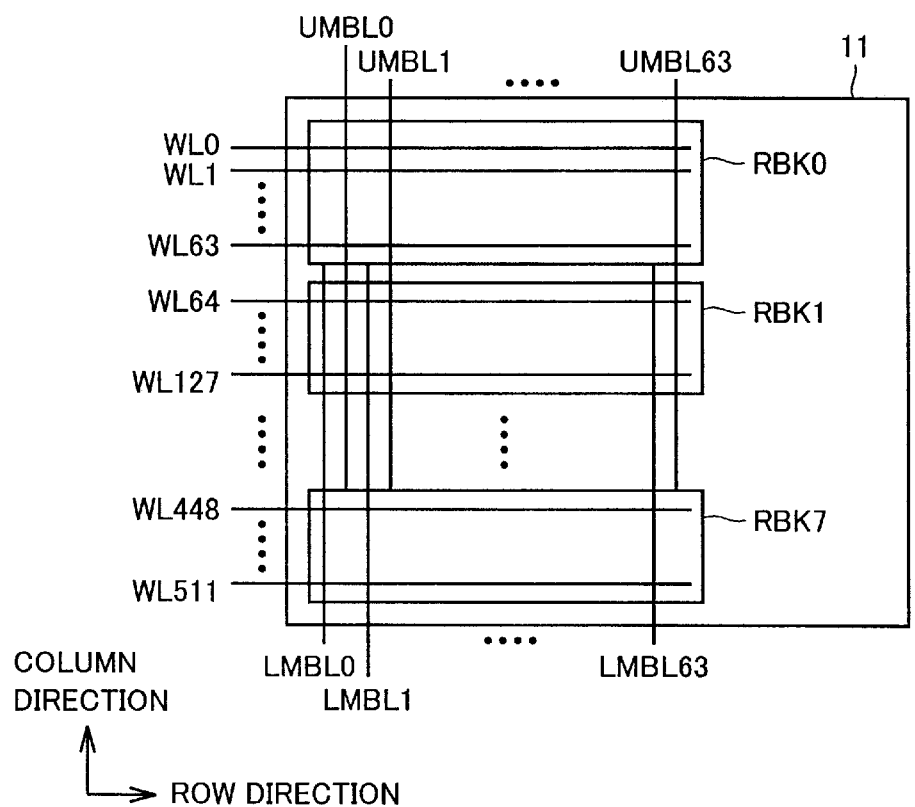
FIG. 2 is a conceptual diagram of memory blocks included in a memory array 11.

Memory array 11 includes memory blocks. FIG. 2 exemplarily shows row memory blocks RBK0 to RBK7 arranged in the column direction in memory array 11.

Hereinafter, row memory blocks RBK0 to RBK7 are sometimes generally referred to as row memory blocks RBK.

Sixty-four word lines WL are provided corresponding to each row memory block RBK.

For example, in row memory block RBK0, word lines WL0 to WL63 are provided corresponding to memory cell rows. In this way, word lines WL0 to WL511 are provided corresponding to memory cell rows.

Main bit lines UMBL0 to UMBL63, LMBL0 to LMBL63 extend in the row direction. Main bit lines UMBL0 to UMBL63, LMBL0 to LMBL63 are shared by row memory blocks RBK0 to RBK7.

Main bit lines UMBL0 to UMBL63 are controlled by column decoder 25. Hereinafter, main bit lines UMBL0 to UMBL63 are sometimes generally referred to as main bit lines UMBL. Main bit lines LMBL0 to LMBL63 are controlled by column decoder 20. Hereinafter, main bit lines LMBL0 to LMBL63 are sometimes generally referred to as main bit lines LMBL.

Main bit lines UMBL and main bit lines LMBL are arranged alternately.

Figure 3:
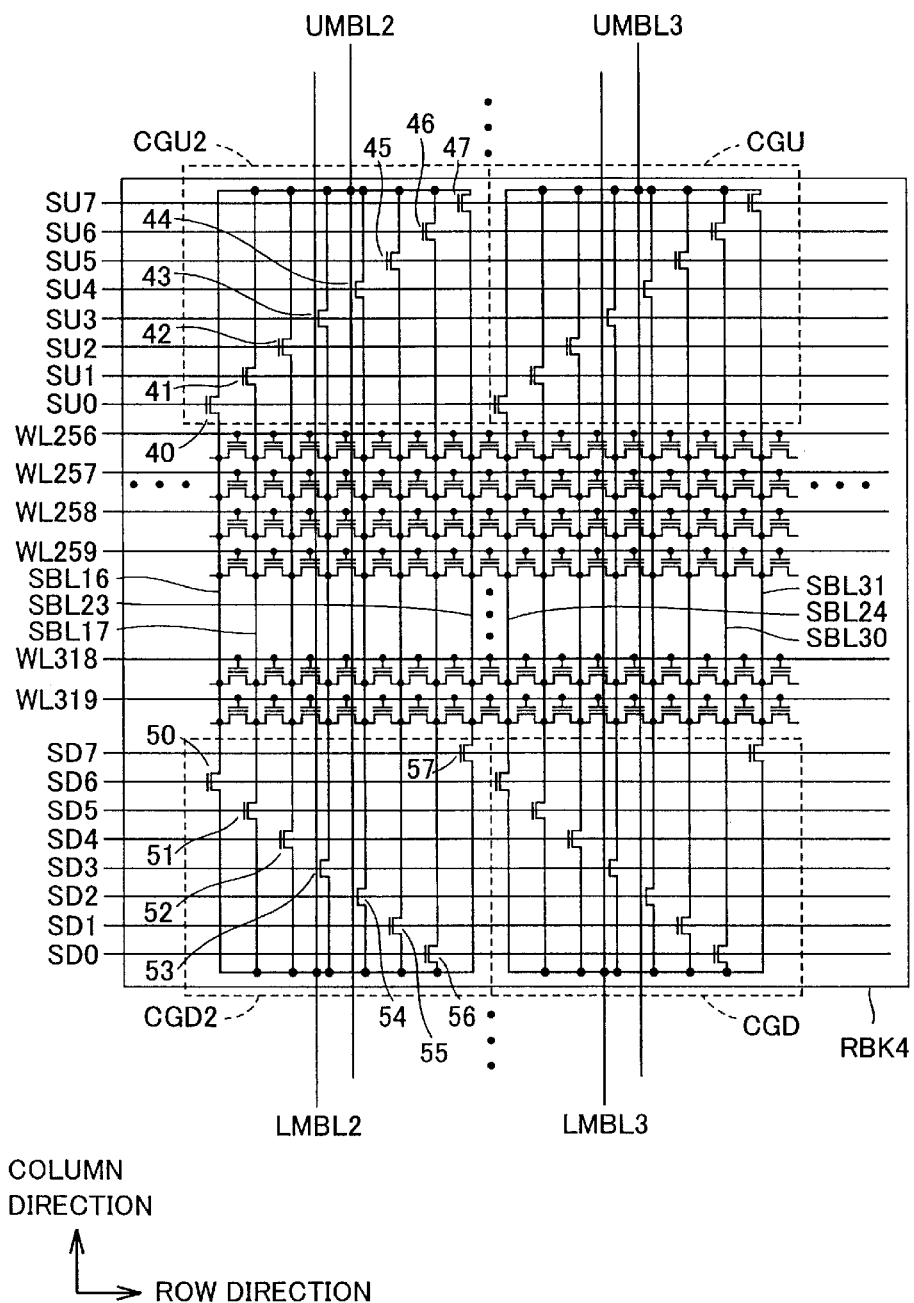
FIG. 3 shows a part of a row memory block.

FIG. 3 shows a part of row memory block RBK4. Sub bit lines are provided corresponding to memory cell columns. More specifically, two sub bit lines are provided on both sides of each memory cell column so that each sub bit line is shared by adjacent two memory cell columns. FIG. 3 exemplarily shows sub bit lines SBL16 to SBL31 provided corresponding to the memory cell columns. Hereinafter, sub bit lines SBL16 to SBL31 are sometimes generally referred to as sub bit lines SBL.

Main bit lines UMBL2, LMBL2 are provided corresponding to eight sub bit lines SBL16 to SBL23. Main bit lines UMBL3, LMBL3 are provided corresponding to eight sub bit lines SBL24 to SBL31. This structure is a so-called hierarchical bit-line structure.

These eight hierarchical sub bit lines SBL are electrically coupled to corresponding main bit lines UMBL, LMBL though corresponding column gate units CGU, CGD, respectively. Note that column gate units CGU, CGD generally refer to individual column gate units.

In FIG. 3, sub bit lines SBL16 to SBL23 are electrically coupled to main bit lines UMBL2 through a column gate unit CGU2. Moreover, sub bit lines SBL16 to SBL23 are electrically coupled to main bit line LMBL2 through a column gate unit CGD2.

Hereinafter, the circuit structure of column gate units CGU2, CGD2 will be considered.

Column gate unit CGU2 includes transistors 40 to 47.

Each of transistors 40 to 47 is provided between a corresponding one of sub bit lines SBL16 to SBL23 and main bit line UMBL2. Transistors 40 to 47 receive signals on gate selection lines SU0 to SU7 at their gates, respectively.

Column gate unit CGD2 includes transistors 50 to 57.

Each of transistors 50 to 57 is provided between a corresponding one of sub bit lines SBL16 to SBL23 and main bit line LMBL2.

Transistors 50 to 56 receive signals on gate selection lines SD6 to SD0 at their gates, respectively. Transistor 57 receives a signal on a gate selection line SD7 at its gate.

Since the other column gate units CGU, CGD have the same structure as that described above, detailed description thereof will not be repeated. Column gate units CGU are arranged in the row direction and share gate selection lines SU0 to SU7. Column gate units CGD are arranged in the row direction and share gate selection lines SD0 to SD7.

Figure 4:
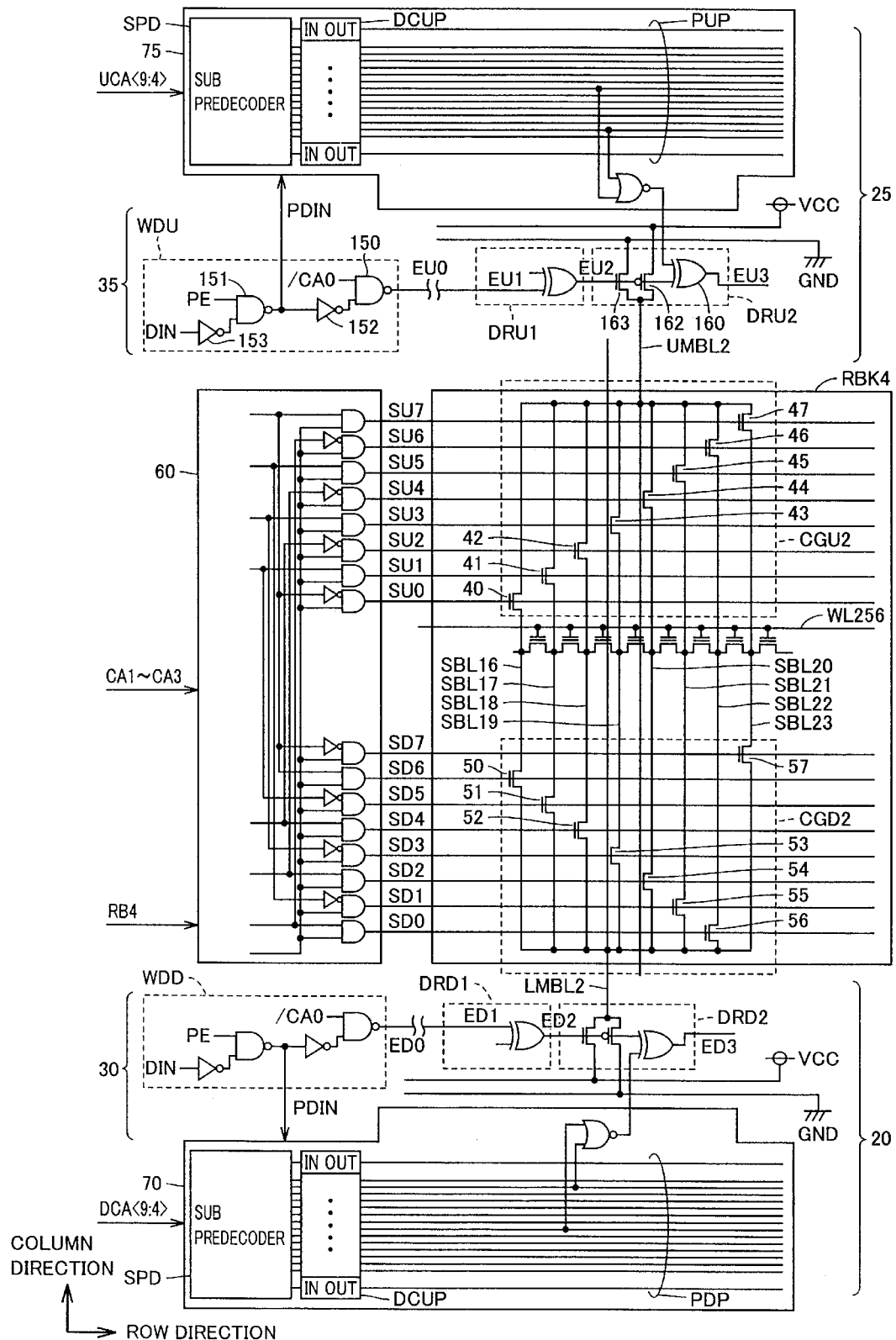
FIG. 4 shows the structure of column selection circuitry for write operation according to a first embodiment of the present invention.

FIG. 4 shows row memory block RBK4 in memory array 11.

Column selection circuitry for write operation according to the present embodiment selects a prescribed bit in a selected memory cell column according to column address CA<9:0>.

Column address CA<y:0> collectively refers to column addresses CA0 to CAy of a plurality of bits. Hereinafter, a plurality of bits of any other signals will be collectively referred to in the same manner. For example, the $m^{th}$ to $n^{th}$ bits of a signal SIG are sometimes collectively referred to as SIG<n:m>. Moreover, column address CA<y:0> is sometimes generally referred to as column address CA.

The column selection circuitry according to the present embodiment selects one of main bit lines UMBL and one of main bit lines LMBL according to column address CA<9:4> corresponding to upper bits of column address CA<9:0>. The column selection circuitry selects one of a plurality of memory cell columns corresponding to main bit lines UMBL, LMBL according to column address CA<3:1> corresponding to lower bits of column address CA<9:0>. The column selection circuitry selects a bit to be accessed in the selected memory cell column according to column address CA0. More specifically, when column address CA0 is "1", the column selection circuitry selects a bit on the right side of the selected memory cell column, that is, bit 1. When column address/CA0 is "1" (hereinafter, a signal denoted with "/" indicates an inverted signal, a negative signal, a complementary signal or the like), the column selection circuitry selects a bit on the left side of the selected memory cell column, that is, bit 2.

Column decoder 20 selects a main bit line LMBL, and divides main bit lines LMBL into two groups based on the selected main bit line LMBL. More specifically, column decoder 20 connects each main bit line LMBL located on one side of the selected main bit line LMBL to one of a power supply voltage VCC and a ground voltage GND and connects each main bit line LMBL located on the other side of the selected main bit line LMBL to the other voltage.

Column decoder 20 includes a driver unit group 30 for controlling main bit lines LMBL, and a predecoder 70 for outputting the column selection result to driver unit group 30.

Column decoder 20 further includes a sub column decoder 60 for selectively activating gate selection lines SU0 to SU7, SD0 to SD7 according to column address CA<3:1> and row block control signal RB<7:0>. It is herein assumed that row block signal RB4 is applied to sub column decoder 60.

Column decoder 25 selects a main bit line UMBL, and divides main bit lines UMBL into two groups based on the selected main bit line UMBL. More specifically, column decoder 25 connects each main bit line UMBL located on one side of the selected main bit line UMBL to one of power supply voltage VCC and ground voltage GND and connects each main bit line UMBL located on the other side of the selected main bit line UMBL to the other voltage.

Column decoder 25 includes a driver unit group 35 for controlling main bit lines UMBL, and a predecoder 75 for outputting the column selection result to driver unit group 35.

Column decoder 20 has the same structure as that of column decoder 25 except sub column decoder 60. Therefore, the structure of column decoder 25 will be described herein.

Figure 5:
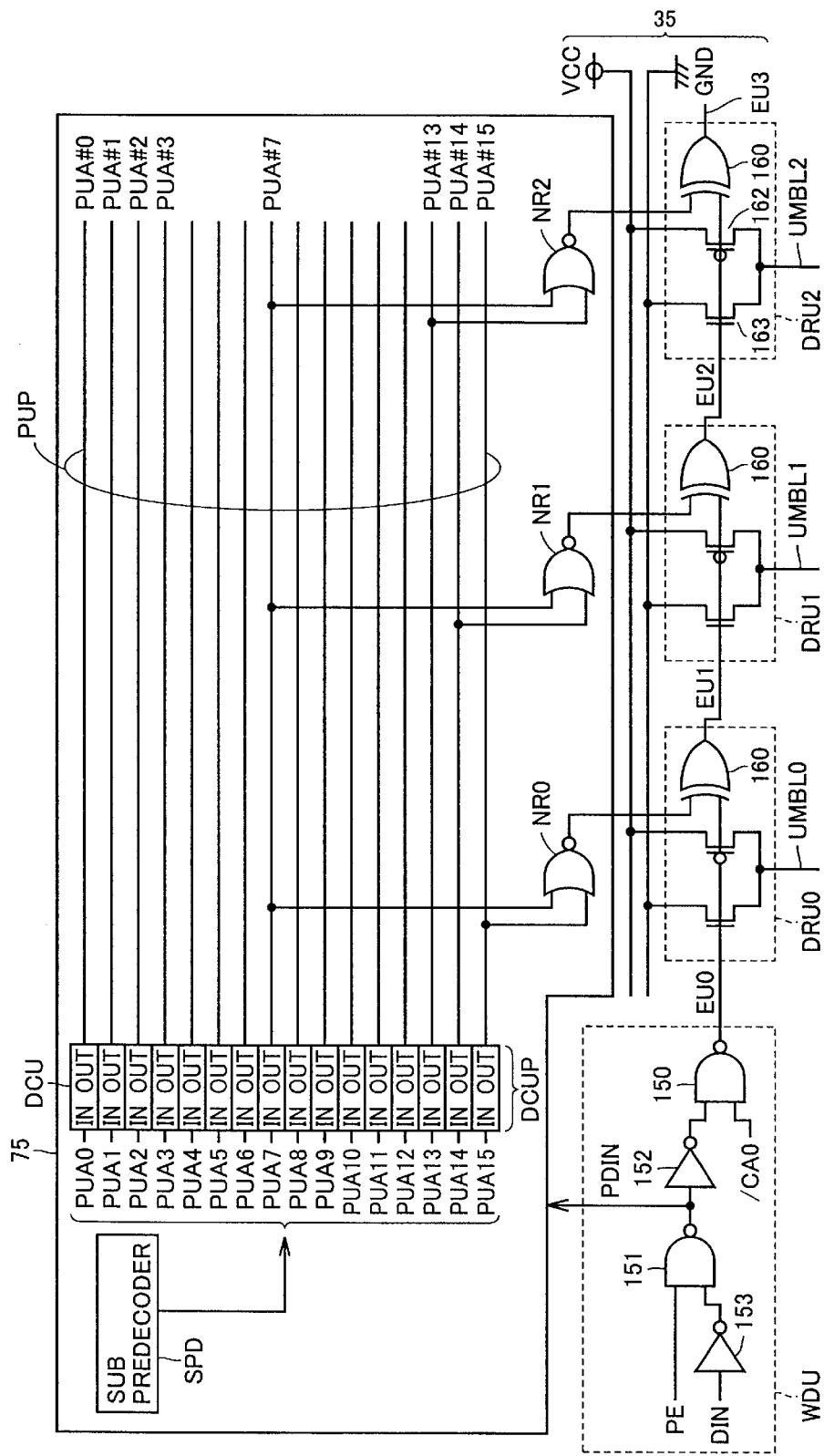
FIG. 5 specifically shows the circuit structure of a part of a column decoder 25.

Referring to FIG. 5, predecoder 75 in column decoder 25 includes a sub predecoder SPD for receiving an internal address and generating predecode signals PUA0 to PUA15 hereinafter, sometimes generally referred to as predecode signals PUA), a decode unit group DCUP formed by a plurality of decode units DCU, and NOR circuits NR provided corresponding to main bit lines UMBL.

Decode unit group DCUP receives predecode signals PUA0 to PUA15 and outputs the decode result, that is, predecode signals PUA#0 to PUA#15, to a decode line group PUP. NOR circuits NR generally refer to individual NOR circuits. FIG. 5 exemplary shows NOR circuits NR0 to NR2 corresponding to main bit lines UMBL0 to UMBL2.

Predecoder 75 outputs the column selection result from NOR circuit NR connected to prescribed two decode lines of decode line group PUP according to an internal address. For example, when the prescribed two decode lines are both activated, NOR circuit NR connected thereto output "H" level as the column selection result. The other NOR circuits NR outputs "L" level.

Sub predecoder SPD receives internal address UCA<9:7> and generates predecode signals PUA8 to PUA15.

Sub predecoder SPD outputs internal address UCA7∩UCA8∩UCA9 as predecode signal PUA8, and outputs internal address /UCA7∩UCA8∩UCA9 as predecode signal PUA9. Sub predecoder SPD also outputs internal address UCA7∩/UCA8∩UCA9 as predecode signal PUA10, and outputs internal address /UCA7∩/UCA8∩UCA9 as predecode signal PUA11. Sub predecoder SPD also outputs internal address UCA7∩UCA8∩/UCA9 as predecode signal PUA12, and also outputs internal address /UCA7∩UCA8∩/UCA9 as predecode signal PUA13. Sub predecoder SPD also outputs internal address UCA7∩/UCA8∩/UCA9 as predecode signal PUA14, and outputs internal address /UCA7∩/UCA8∩/UCA9 as predecode signal PUA15. For internal address UCA<63> as well, sub predecoder SPD generates predecode signals PUA0 to PUA7 in the same manner as that described above for predecode signals PUA8 to PUA15. Sub predecoder SPD selectively sets one of predecode signals PUA8 to PUA15 to "H" level according to internal address UCA<9:7>, and also selectively sets one of predecode signals PUA0 to PUA7 to "H" level according to internal address UCA<6:4>. Note that, in the specification, "∩" indicates an AND operation and "∪" indicates an OR operation.

Figure 6:
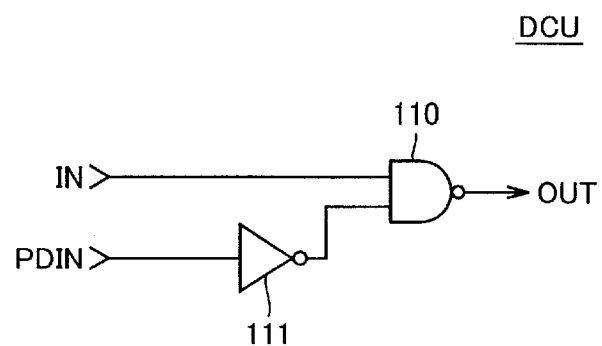
FIG. 6 shows the circuit structure of a decode unit DCU.

Referring to FIG. 6, each decode unit DCU includes a NAND circuit 110 and an inverter 111.

NAND circuit 110 receives an input signal IN and also receives an inverted signal of a control signal PDIN through inverter 111, and outputs the NAND operation result of the received signals as an output signal OUT. For example, if control signal PDIN is at "L" level and input signal IN (i.e., predecode signal PUA) is at "H" level, output signal OUT is activated to "L" level. Otherwise, output signal OUT is inactivated to "H" level. In other words, each decode unit DCU is triggered by control signal PDIN ("L" level) to output input signal IN (i.e., predecode signal) to a corresponding decode line of decode line group PUP.

Accordingly, when control signal PDIN is at "L" level, predecoder 75 selectively activates prescribed two decode lines of decode line group PUP to "L" level according to internal address UCA<9:4>. NOR circuit NR connected to the prescribed two decode lines outputs "H" level as the column selection result.

Referring back to FIG. 5, driver unit group 35 includes a write control circuit WDU and driver units DRU provided corresponding to main bit lines UMBL. Note that driver units DRU generally refer to individual driver units. FIG. 5 exemplarily shows driver units DRU0 to DRU2 corresponding to main bit lines UMBL0 to UMBL2. Each of driver units DRU0 to DRU2 receives the column selection result from a corresponding one of NOR circuits NR0 to NR2.

Write control circuit WDU includes NAND circuits 150, 151 and inverters 152, 153.

NAND circuit 151 receives a write control signal PE (which is a signal indicating that write operation is ready) and also receives an inverted signal of write data DIN through inverter 153, and outputs the NAND operation result of the received signals to inverter 152 as a control signal PDIN. NAND 150 circuit receives column address /CA0 and also receives an inverted signal of control signal PDIN through inverter 152, and outputs the NAND operation result of the received signals as a control signal EU0. It is herein assumed that write data DIN is at "L" level when data "0" is to be written to a selected bit of a selected memory cell.

Each driver unit DRU has the same circuit structure. Therefore, the circuit structure of driver unit DRU2 corresponding to main bit line UMBL2 will be described herein.

Driver unit DRU2 includes an exclusive-OR circuit 160 and transistors 162, 163.

It is herein assumed that transistor 162 is a P-channel MOS (metal oxide semiconductor) transistor and transistor 163 is an N-channel MOS transistor. However, the present invention is not limited to this.

Exclusive-OR circuit 160 receives the column selection result of corresponding NOR circuit NR2 and an output signal of driver unit DRU1 in the previous stage, and outputs the exclusive-OR operation result of the received signals to a driver unit of the subsequent stage as a control signal EU3.

Transistor 162 is provided between main bit line UMBL2 and power supply voltage VCC, and transistor 163 is provided between main bit line UMBL2 and ground voltage GND. Transistors 162, 163 receive a control signal EU2, that is, an output signal of driver unit DRU1, at their gates. Accordingly, transistors 162, 163 operate in a complementary manner in response to control signal EU2, whereby main bit line UMBL2 is electrically coupled to either power supply voltage VCC or ground voltage GND.

As shown in FIG. 5, write control circuit WDU and driver units DRU are connected in series. Each driver unit DRU electrically couples a corresponding main bit line UMBL to either power supply voltage VCC or ground voltage GND according to a control signal, that is, an output signal of driver unit DRU in the previous stage.

Hereinafter, operation of driver unit group 35 will be described.

It is herein assumed that write control signal PE is at "H" level, write data DIN is at "L" level and column address signal /CA0 is "1" (i.e., "H" level). It is also herein assumed that prescribed two decode lines are activated according to an internal address, and NOR circuit NR2 outputs "H" level as the column selection result. Note that the other NOR circuits NR output "L" level as the column selection result.

In this case, write control circuit WDU outputs "L" level as a control signal EU0. Driver unit DRU0 outputs the exclusive-OR operation result ("L" level) of control signal EU0 and the column selection result ("L" level) of corresponding NOR circuit NR0 as a control signal EU1. Similarly, driver unit DRU1 outputs "L" level as a control signal EU2. Driver unit DRU2 outputs the exclusive-OR operation result ("H" level) of control signal EU2 and the column selection result ("H" level) of corresponding NOR circuit NR2 as a control signal EU3. Accordingly, "H" level which is output from NOR circuit NR2 as the column selection result triggers inversion of control signal EU transmitted from the previous stage, and the inverted control signal is output to the following stage. Thereafter, a signal having the same logic level is successively applied to each of the following driver units DRU. On the other hand, when column address /CA0 is "0" (i.e., "L" level), write control circuit WDU outputs "H" level as control signal EU0, and driver units DRU0, DRU1 output "H" level as control signals EU1, EU2, respectively. "H" level which is output from NOR circuit NR2 as the column selection result triggers inversion of control signal EU2 transmitted from the previous stage to driver unit DRU2. As a result, driver unit DRU2 outputs "L" level as control signal EU3. Thereafter, a signal having the same logic level is successively applied to each of the following driver units DRU.

Although the above description is given for column decoder 25, the same applies to column decoder 20.

Column decoder 20 includes a predecoder 70 and a driver unit group 30.

Predecoder 70 has the same structure as that of predecoder 75. Predecoder 70 decodes a received address and outputs the decode result to a decode line group PDP. More specifically, sub predecoder SPD receives internal address DCA<9:4> and generates predecode signals PDA0 to PDA15 (hereinafter, sometimes generally referred to as predecode signals PDA) in the same manner as that described above for predecode signals PUA0 to PUA15. A decode unit group DCUP receives predecode signals PDA0 to PDA15 and outputs decode results PDA#0 to PDA#15 to decode line group PDP in the same manner as that described above. NOR circuit NR connected to activated prescribed two decode lines of decode line group PDP outputs "H" level as the column selection result.

Driver unit group 30 includes a write control circuit WDD and driver units DRD provided corresponding to main bit lines LMBL. Driver units DRD are connected in series. Since driver unit group 30 has the same circuit structure and the same connection of the circuits as those of driver unit group 35, detailed description thereof will not be repeated.

Driver unit group 30 operates in the same manner as that of driver unit group 35. More specifically, provided that the conditions are the same, that is, when column address /CA0 is "1" (i.e., "H" level), write control circuit WDD outputs "L" level as a control signal ED0. Driver units DRD0, DRD1 output "L" level as control signals ED1, ED2 in response to the column selection result ("L" level) received from corresponding NOR circuits, respectively. Driver unit DRD2 outputs the exclusive-OR operation result ("H" level) of control signal ED2 and the column selection result ("H" level) received from a corresponding NOR circuit as a control signal ED3. Accordingly, "H" level which is output from the NOR circuit as the column selection result triggers inversion of control signal ED transmitted from the previous stage, and the inverted control signal is output to the subsequent stage. Thereafter, a signal having the same logic level is successively output to each of the following driver units DRD. On the other hand, when column address /CA0 is at "L" level, write control circuit WDD outputs "H" level as control signal ED0. In this case as well, "H" level which is output from the NOR circuit as the column selection result triggers inversion of control signal ED transmitted from the previous stage, and the inverted control signal is output to the subsequent stage.

Figure 7:
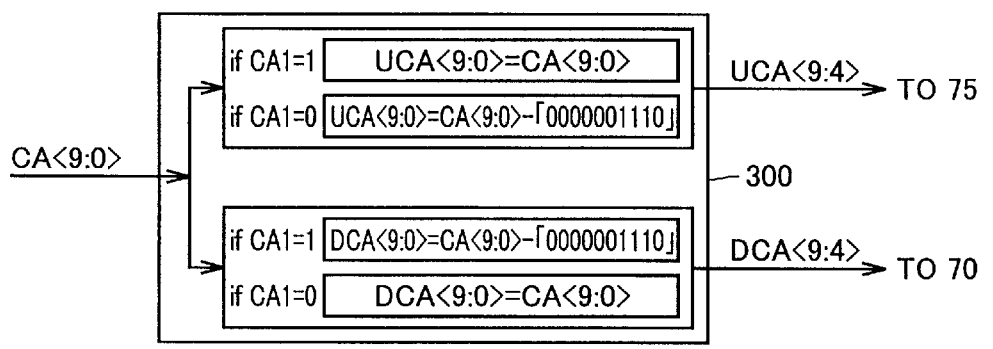
FIG. 7 is a conceptual diagram of an address converter 300 according to the first embodiment.

Referring to FIG. 7, an address converter 300 of the first embodiment generates internal addresses DCA, UCA to be applied to column decoders 20, 25, respectively. For example, regarding internal address UCA, if column address CA1 is "0" and two sub bit lines located on both sides of a selected memory cell column (i.e., two sub bit lines corresponding to the selected memory cell column) are electrically coupled to the same main bit line UMBL, address converter 300 converts column address CA into internal address UCA so as to allow column decoder 25 to select a main bit line UMBL corresponding to an address right before the address of the main bit line UMBL connected to the two sub bit lines corresponding to the selected memory cell column. On the other hand, if two sub bit lines corresponding to a selected memory cell column are electrically coupled to adjacent two main bit lines UMBL, respectively, that is, if a memory cell column located in a boundary region is selected, address converter 300 converts column address CA into internal address UCA so as to allow column decoder 25 to select a main bit line UMBL as usual instead of selecting a main bit line UMBL corresponding to the previous address. When column address CA1 is "1", column address CA is directly used as internal address UCA.

Regarding internal address DCA, if column address CA1 is "1" and two sub bit lines located on both sides of a selected memory cell column (i.e., two sub bit lines corresponding to the selected memory cell column) are electrically coupled to the same main bit line LMBL, address converter 300 converts column address CA into internal address DCA so as to allow column decoder 20 to select a main bit line LMBL corresponding to an address right before the address of the main bit line LMBL connected to the two sub bit lines corresponding to the selected memory cell column. On the other hand, if two sub bit lines corresponding to a selected memory cell column are electrically coupled to adjacent two main bit lines LMBL, respectively, that is, if a memory cell column located in a boundary region is selected, address converter 300 converts column address CA into internal address DCA so as to allow column decoder 20 to select a main bit line LMBL as usual instead of selecting a main bit line LMBL corresponding to the previous address. When column address CA1 is "0", column address CA is directly used as internal address UCA.

Referring to FIG. 7, address converter 300 receives column address CA<9:0> and generates internal addresses UCA<9:4>, DCA<9:4> to be applied to predecoders 75, 70, respectively. More specifically, when column address CA1 is "1", address converter 300 defines column address CA<9:0> as internal address UCA<9:0>, and defines column address CA<9:0>–"0000001110" as internal address DCA<9:0>. On the other hand, when column address CA1 is "0", address converter 300 defines column address CA<9:0>–"0000001110" as internal address UCA<9:0>, and defines column address CA<9:0> as internal address DCA<9:0>.

Figure 8:
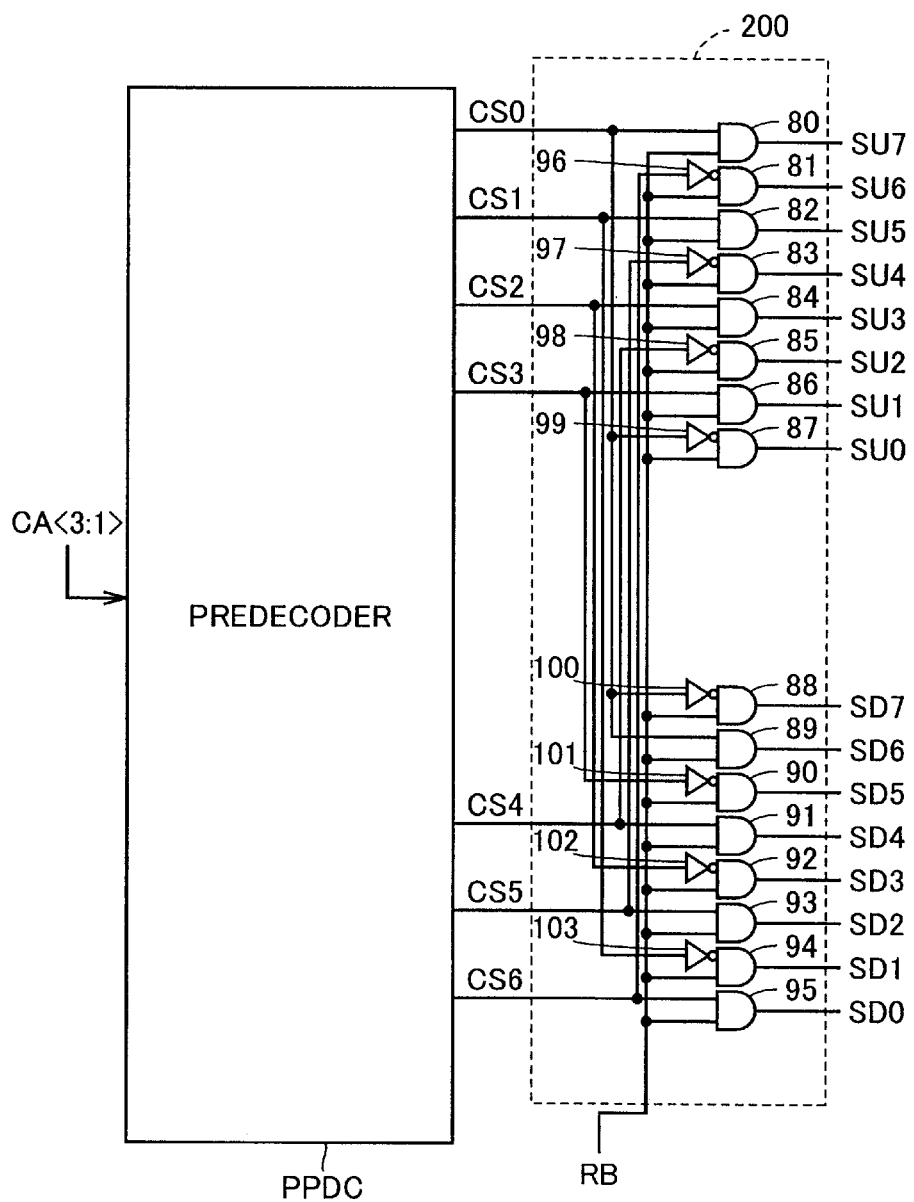
FIG. 8 shows the circuit structure of a sub column decoder 60.

Referring to FIG. 8, sub column decoder 60 includes a predecoder PPDC for receiving column address CA<3:1> and generating predecode signals CS0 to CS6, and a logic circuit 200 for receiving predecode signals CS0 to CS6 and a block control signal RB and selectively activating gate selection lines SU0 to SU7, SD0 to SD7.

Hereinafter, predecode signals CS0 to CS6 generated by predecoder PPDC will be described.

Predecoder PPDC receives column address CA<3:1> and outputs column address /CA1∪(CA3∩CA2∩)CA1) as predecode signal CS0. Predecoder PPDC also outputs column address (/CA3∩CA1)∪(CA3∩CA1)∪(CA3∩/CA2∩/CA1) as predecode signal CS1, and outputs column address (/CA3∩CA1)∪(CA3∩CA1)∪(/CA3∩CA2∩CA1) as predecode signal CS2. Predecoder PPDC also outputs column address CA1∪(/CA3∩/CA2∩/CA1) as predecode signal CS3, and outputs column address (CA3∩/CA1)∪(/CA3∩/CA2∩CA1)∪(/CA3∩CA2∩/CA1) as predecode signal CS4. Predecoder PPDC also outputs column address (/CA3∩CA1)∪(CA3∩/CA1) as predecode signal CS5, and outputs column address (/CA3∩CA1)∪(CA3∩/CA2∩CA1) ∪(CA3∩CA2∩/CA1) as predecode signal CS6.

Logic circuit 200 includes AND circuits 80, 81, 82, 83, 84, 85, 86, 87. AND circuit 80 receives predecode signal CS0 and row block control signal RB and outputs the AND operation result of the received signals to gate selection line SU7. AND circuit 81 receives an inverted signal of predecode signal CS6 through an inverter 96 and receives row block control signal RB, and outputs the AND operation result of the received signals to gate selection line SU6. AND circuit 82 receives predecode signal CS1 and row block control signal RB and outputs the AND operation result of the received signals to gate selection line SU5. AND circuit 83 receives an inverted signal of predecode signal CS5 through an inverter 97 and receives row block control signal RB, and outputs the AND operation result of the received signals to gate selection line SU4. AND circuit 84 receives predecode signal CS2 and row block control signal RB and outputs the AND operation result of the received signals to gate selection line SU3. AND circuit 85 receives an inverted signal of predecode signal CS4 through an inverter 98 and receives row block control signal RB, and outputs the AND operation result of the received signals to gate selection line SU2. AND circuit 86 receives predecode signal CS3 and row block control signal RB and outputs the AND operation result of the received signals to gate selection line SU1. AND circuit 87 receives an inverted signal of predecode signal CS0 through an inverter 99 and receives row block control signal RB, and outputs the AND operation result of the received signals to gate selection line SU0.

Logic circuit 200 further includes AND circuits 88, 89, 90, 91, 92, 93, 94, 95. AND circuit 88 receives an inverted signal of predecode signal CS0 through an inverter 100 and receives row block control signal RB, and outputs the AND operation result of the received signals to gate selection line SD7. AND circuit 89 receives predecode signal CS0 and row block control signal RB and outputs the AND operation result of the received signals to gate selection line SD6. AND circuit 90 receives an inverted signal of predecode signal CS3 through an inverter 101 and receives row block control signal RB, and outputs the AND operation result of the received signals to gate selection line SD5. AND circuit 91 receives predecode signal CS4 and row block control signal RB and outputs the AND operation result of the received signals to gate selection line SD4. AND circuit 92 receives an inverted signal of predecode signal CS2 through an inverter 102 and receives row block control signal RB, and outputs the AND operation result of the received signals to gate selection line SD3. AND circuit 93 receives predecode signal CS5 and row block control signal RB and outputs the AND operation result of the received signals to gate selection line SD2. AND circuit 94 receives an inverted signal of predecode signal CS1 through an inverter 103 and receives row block control signal RB, and outputs the AND operation result of the received signals to gate selection line SD1. AND circuit 95 receives predecode signal CS6 and row block control signal RB and outputs the AND operation result of the received signals to gate selection line SD0.

Gate selection lines SU0 to SU7, SD0 to SD7 are gate selection lines of the transistors provided corresponding to sub bit lines SBL. In column gate units CGU, CGD, two transistors corresponding to a sub bit line SBL are turned ON/OFF in a complementary manner.

More specifically, sub column decoder 60 selectively activates gate selection lines SU0 to SU7, SD0 to SD7 according to column address CA<3:1>. As a result, in column gate unit CGU, each sub bit line SBL located on one side (left side) of a prescribed memory cell column is electrically coupled to main bit line UMBL. Moreover, in column gate unit CGD, each sub bit line SBL located on the other side (right side) of the prescribed memory cell column is electrically coupled to main bit line LMBL.

Figure 9:
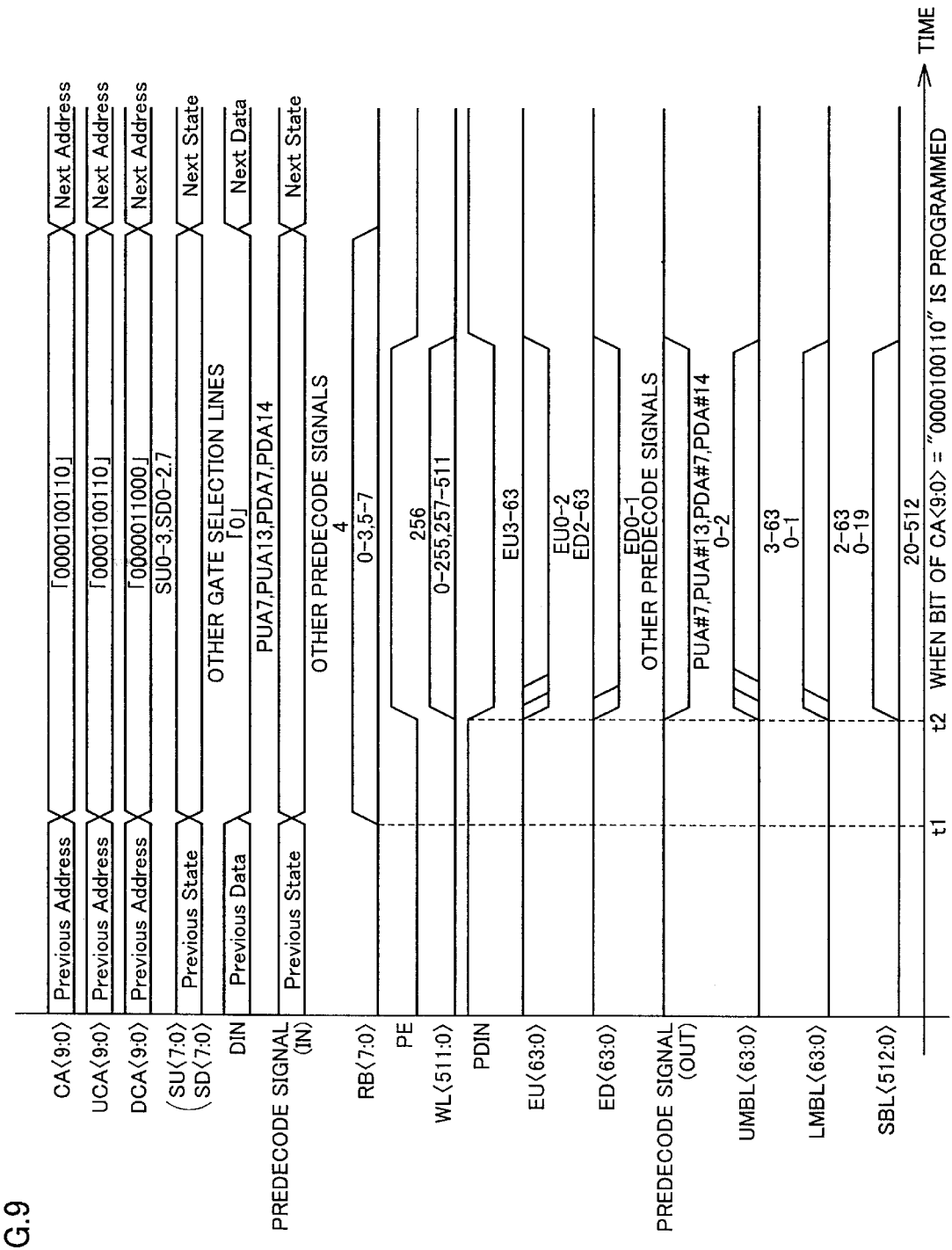
FIG. 9 is a timing chart illustrating write operation according to the first embodiment.

Hereinafter, write operation will be described with reference to the timing chart of FIG. 9. In the illustrated example, data is to be written to bit 2 on the left side of the memory cell column which is located between sub bit lines SBL19, SBL20 electrically coupled to main bit lines UMBL2, LMBL2 corresponding to column address CA<9:0> of "0000100110". It is herein assumed that row memory block RBK4 is selected. Therefore, row block selection signal RB4 is set to "H" level.

Column address CA<9:0> is applied at time t1. Since column address CA1 is "1", address converter 300 defines column address CA<9:0> as internal address UCA<9:0>. In other words, internal address UCA<9:0> is "0000100110". Moreover, address converter 300 defines column address CA<9:0>−"0000001110" as internal address DCA<9:0>. In other words, internal address DCA<9:0> is "0000011000".

At time t1, sub column decoder 60 sets gate selection lines SU0 to SU3, SD0 to SD2, SD7 to "H" level according to the applied column address CA<3:1> and row block control signal RB4 ("H" level), and sets the other gate selection lines SU, SD to "L" level.

Internal addresses UCA<9:4>, DCA<9:4> are respectively applied from address converter 300 to predecoder 75 of column decoder 25 and predecoder 70 of column decoder 20. Each of sub predecoders SPD in predecoder 75, 70 outputs the received internal address UCA, DCA as predecode signals. In the illustrated example, sub predecoder SPD in predecoder 75 activates predecode signals PUA7, PUA13 to "H" level according to internal address UCA<9:4>. On the other hand, sub predecoder SPD in predecoder 70 activates predecode signals PDA7, PDA14 to "H" level according to internal address DCA<9:4>. The other predecode signals are inactive at "L" level.

At time t1, write data DIN is set to "L" level.

At time t2, write control signal PE is activated to "H" level and control signal PDIN is set to "L" level.

In response to control signal PDIN ("L" level), decode unit group DCUP in predecoder 75 is activated and outputs the decode result obtained based on predecode signals PUA to decode line group PUP. Similarly, decode unit group DCUP in predecoder 70 outputs the decode result obtained based on predecode signals PDA to decode line group PDP. In other words, each decode unit group DCUP outputs the decode result of corresponding predecode signals PUA, PDA to corresponding decode line group PUP, PDP. As a result, prescribed two decode lines of decode line group PUP are activated to "L" level. Moreover, prescribed two decode lines of decode line group PDP are activated to "L" level. In the illustrated example, decode lines of decode line group PUP corresponding to predecode signals PUA7, PUA13 are activated, whereby corresponding predecode signals PUA#7, PUA#13 are set to "L" level. The other decode lines are at "H" level. In column decoder 25, NOR circuit NR2 is connected to the prescribed two decode lines corresponding to predecode signals PUA#7, PUA#13, based on the decode result. NOR circuit NR2 thus outputs "H" level to driver unit DRU2 as the column selection result.

Moreover, of decode line group PDP, prescribed two decode lines corresponding to predecode signals PDA7, PDA14 are activated, whereby predecode signals PDA#7, PDA#14 are set to "L" level. In column decoder 20, NOR circuit NR1 is connected to the prescribed two decode lines corresponding to predecode signals PDA#7, PDA#14, based on the decode result. NOR circuit NR1 thus outputs "H" level to driver unit DRD1 as the column selection result.

Hereinafter, driver unit group 35 will be considered.

When column address /CA0 is "1" (i.e., "H" level), write control circuit WDU outputs "L" level as control signal EU0. Driver unit DRU0 then outputs "L" level as control signal EU1 based on the control signal EU0 and the column selection result ("L" level) which is received from NOR circuit NR0. Similarly, driver unit DRU1 outputs "L" level as control signal EU2 based on the control signal EU1 and the column selection result ("L" level) which is received from NOR circuit NR1. Driver unit DRU2 outputs "H" level as control signal EU3 based on the control signal EU2 and the column selection result ("H" level) which is received from NOR circuit NR2. Similarly, each of the driver units DRU in the following stages outputs "H" level as a control signal EU4 to EU63.

Accordingly, main bit lines UMBL0 to UMBL2 are electrically coupled to power supply voltage VCC according to L-level control signals EU0 to EU2. Main bit lines UMBL3 to UMBL63 are electrically coupled to ground voltage GND according to H-level control signals EU3 to EU63.

Hereinafter, driver unit group 30 will be considered.

When column address /CA0 is "1" (i.e., "H" level), write control circuit WDD outputs "L" level as control signal ED0. Since driver unit group 30 has the same structure as that of driver unit group 35, each driver unit DRD outputs a control signal to the subsequent stage according to a control signal ED of the previous stage and the column selection result received from a corresponding NOR circuit. In driver unit group 30, driver unit DRD1 receives the column selection result ("H" level) as described above. Accordingly, driver unit DRD0 outputs "L" level as control signal ED1, and driver unit DRD1 outputs "H" level as control signal ED2 according to the column selection result ("H" level). Similarly, each of the following driver units DRD outputs "H" level as a control signal ED3 to ED63.

Accordingly, main bit lines LMBL0, LMBL1 are electrically coupled to power supply voltage VCC according to L-level control signals ED0, ED1. Main bit lines LMBL2 to LMBL63 are electrically coupled to ground voltage GND according to H-level control signals ED2 to ED63.

As a result, main bit lines UMBL0, UMBL1 and main bit lines LMBL0, LMBL1 corresponding thereto are electrically coupled to power supply voltage VCC, and main bit line UMBL2 and main bit line LMBL2 corresponding thereto are electrically coupled to power supply voltage VCC and ground voltage GND, respectively. Main bit lines UMBL3 to UMBL63 and main bit lines LMBL3 to LMBL63 corresponding thereto are electrically coupled to ground voltage GND.

When sub column decoder 60 selects gate selection lines SU, SD as described above, column gate unit CGU2 electrically couples sub bit lines SBL16 to SBL19 located on one side (left side) of the memory cell column between sub bit lines SBL19, SBL20 to main bit line UMBL2 connected to power supply voltage VCC. On the other hand, column gate unit CGD2 electrically couples sub bit lines SBL20 to SBL23 located on the other side (right side) of the memory cell column to main bit line LMBL2 connected to ground voltage GND.

At time t2, a selected word line is activated. It is herein assumed that a word line WL256 is activated.

As a result, data is written to bit 2 on the left side of a corresponding memory cell in the memory cell column located between sub bit lines SBL19, SBL20.

Regarding the other sub bit lines SBL (e.g., sub bit lines SBL0 to SBL15), corresponding main bit lines UMBL0, UMBL1, LMBL0, LMBL1 are electrically coupled to power supply voltage VCC. Therefore, sub bit lines SBL0 to SBL15 are set to the same voltage level as that of sub bit lines SBL16 to SBL19. Similarly, regarding a sub bit line SBL24 and the following sub bit lines, corresponding main bit lines UMBL, LMBL are electrically coupled to ground voltage GND. Therefore, these sub bit lines are set to the same voltage level as that of sub bit lines SBL20 to SBL23.

With the above structure, data is written to a selected memory cell in a selected memory cell column, and a first sub bit line group located on one side of the selected memory cell column is set to the same voltage level. Moreover, a second sub bit line group located on the other side of the selected memory cell column is set to the same voltage level which is complementary to the voltage level of the first sub bit line group. This suppresses generation of a through current during write operation even when the memory array structure in which each sub bit line SBL is shared by adjacent two memory cell columns is employed. As a result, erroneous writing, that is, "write disturb", can be prevented.

Figure 10:
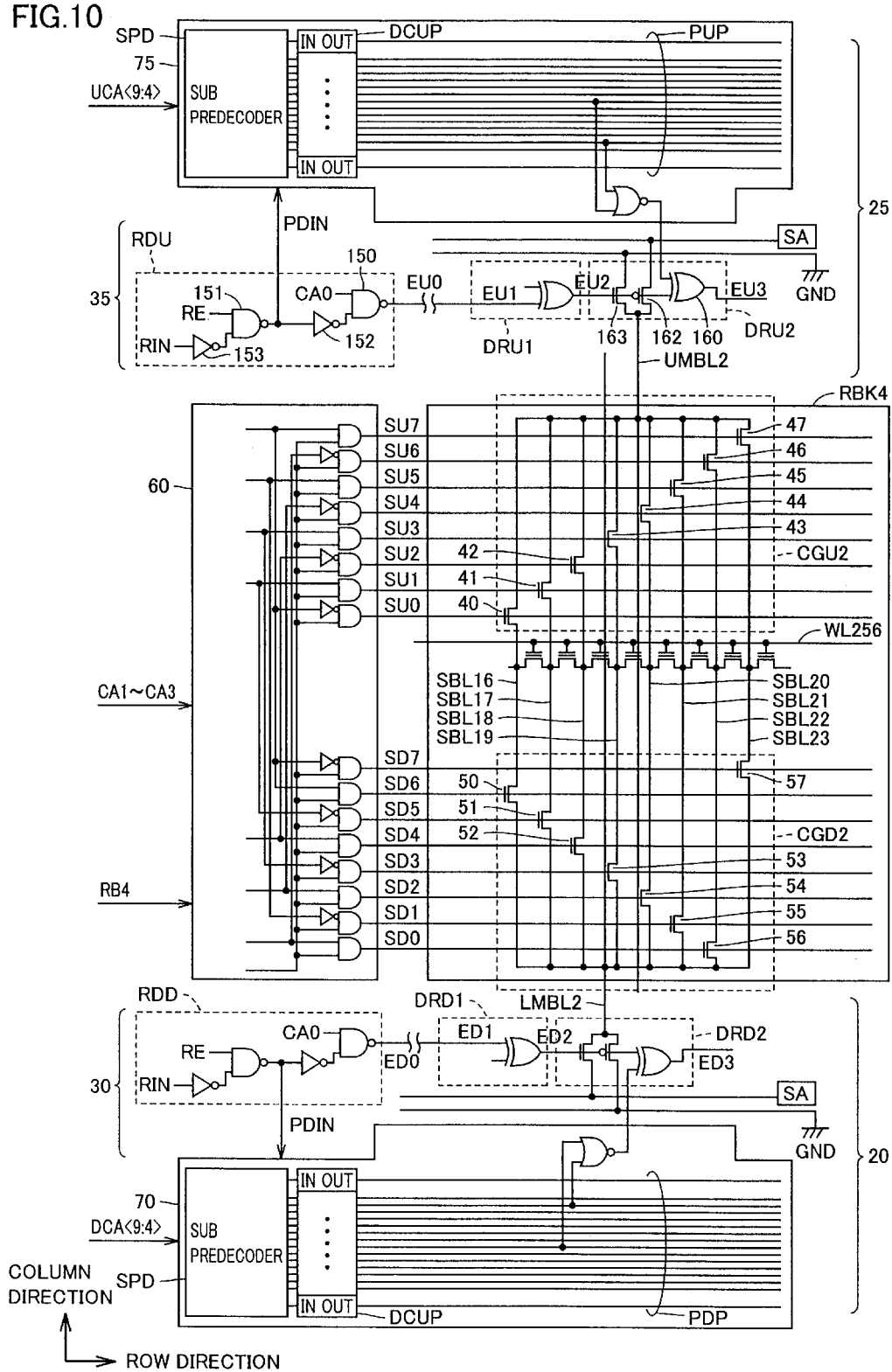
FIG. 10 shows the structure of column selection circuitry for read operation according to the first embodiment.

FIG. 10 shows the circuit structure of column selection circuitry for read operation according to the first embodiment. This column selection circuitry is different from the column selection circuitry for write operation according to the first embodiment in that write control circuits WDU, WDD are replaced with read control circuits RDU, RDD, respectively, and in that power supply voltage VCC is replaced with a sense amplifier SA. Since this column selection circuitry is otherwise the same as the columns election circuitry for write operation, detailed description thereof will not be repeated. It is herein assumed that sense amplifier SA senses the data level of a selected memory cell at a prescribed voltage (e.g., 2 V) in read operation.

Read control circuits RDU, WDD have the same structure as that of write control circuits WDU, WDD except that read control circuits RDU, RDD receive a read control signal RE indicating start of read operation instead of write control signal PE, receive a read signal RIN fixed to "L" level instead of write data DIN, and receive a column address CA0 instead of column address /CA0.

Figure 11:
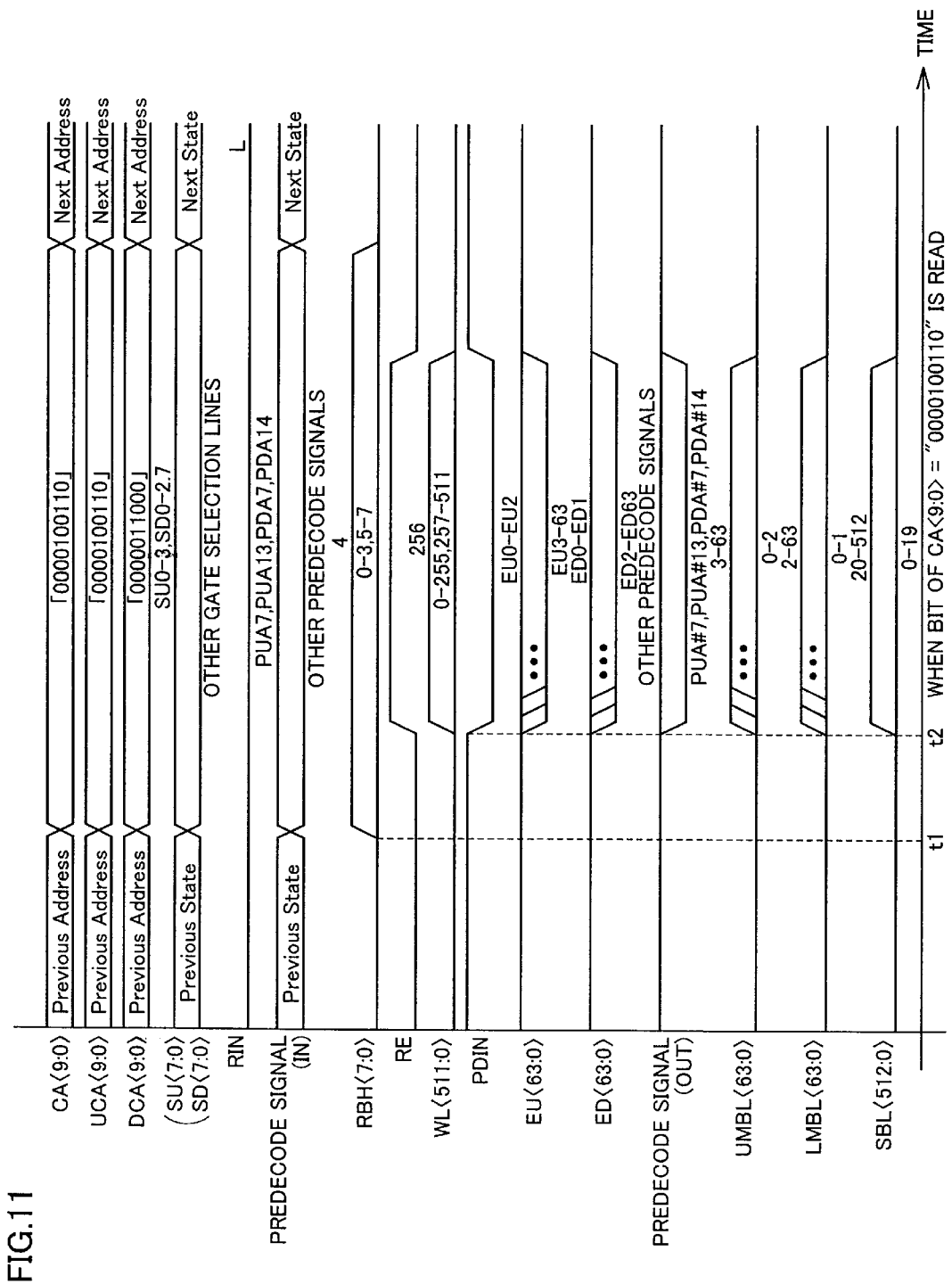
FIG. 11 is a timing chart illustrating read operation according to the first embodiment.

Hereinafter, read operation will be described with reference to the timing chart of FIG. 11. In the illustrated example, data is to be read from bit 2 on the left side of the memory cell column which is located between sub bit lines SBL19, SBL20 electrically coupled to main bit lines UMBL2, LMBL2 corresponding to column address CA<9:0> of "0000100110".

Column address CA<9:0> is applied at time t1. Since column address CA1 is "1", address converter 300 defines column address CA<9:0> as internal address UCA<9:0>. In other words, internal address UCA<9:0> is "0000100110". Moreover, address converter 300 defines column address CA<9:0>–"0000001110" as internal address DCA<9:0>. In other words, internal address DCA<9:0> is "0000011000".

At time t1, sub column decoder 60 sets gate selection lines SU0 to SU3, SD0 to SD2, SD7 to "H" level according to the applied column address CA<3:1> and row block control signal RB4 ("H" level), and sets the other gate selection lines SU, SD to "L" level.

Internal addresses UCA<9:4>, DCA<9:4> are respectively applied from address converter 300 to predecoder 75 of column decoder 25 and predecoder 70 of column decoder 20. Each of sub predecoders SPD in predecoder 75, 70 outputs the received internal address UCA, DCA as predecode signals. In the illustrated example, sub predecoder SPD in predecoder 75 activates predecode signals PUA7, PUA13 to "H" level according to internal address UCA<9:4>. On the other hand, sub predecoder SPD in predecoder 70 activates predecode signals PDA#7, PDA#14 to "H" level according to internal address DCA<9:4>. The other predecode signals are inactive at "L" level.

At time t1, read data RIN is set to "L" level.

At time t2, read control signal RE is activated to "H" level and control signal PDIN is set to "L" level.

In response to control signal PDIN ("L" level), decode unit group DCUP in predecoder 75 is activated and outputs the decode result obtained based on predecode signals PUA to decode line group PUP. Similarly, decode unit group DCUP in predecoder 70 outputs the decode result obtained based on predecode signals PDA to decode line group PDP. In other words, each decode unit group DCUP outputs the decode result of corresponding predecode signals PUA, PDA to corresponding decode line group PUP, PDP. As a result, prescribed two decode lines of decode line group PUP are activated to "L" level. Moreover, prescribed two decode lines of decode line group PDP are activated to "l" level. In the illustrated example, decode lines of decode line group PUP corresponding to predecode signals PUA#7, PUA#13 are activated to "L" level. The other decode lines are at "H" level. In column decoder 25, NOR circuit NR2 is connected to the prescribed two decode lines corresponding to predecode signals PUA#7, PUA#13, based on the decode result. NOR circuit NR2 thus outputs "H" level to driver unit DRU2 as the column selection result.

Moreover, of decode line group PDP, prescribed two decode lines corresponding to predecode signals PDA#7, PDA#14 are activated to "L" level. In column decoder 20, NOR circuit NR1 is connected to the prescribed two decode lines corresponding to predecode signals PDA#7, PDA#14, based on the decode result. NOR circuit NR1 thus outputs "H" level to driver unit DRD1 as the column selection result.

Hereinafter, driver unit group 35 will be considered.

When column address CA0 is "0" (i.e., "L" level), read control circuit RDU outputs "H" level as control signal EU0. Driver unit DRU0 then outputs "H" level as control signal EU1 based on the control signal EU0 and the column selection result ("L" level) which is received from NOR circuit NR0. Similarly, driver unit DRU1 outputs "H" level as control signal EU2 based on the control signal EU1 and the column selection result ("L" level) which is received from NOR circuit NR1. Driver unit DRU2 outputs "L" level as control signal EU3 based on the control signal EU2 and the column selection result ("H" level) which is received from NOR circuit NR2. Similarly, each of the driver units DRU in the following stages outputs "L" level as a control signal EU4 to EU63.

Accordingly, main bit lines UMBL0 to UMBL2 are electrically coupled to ground voltage GND according to H-level control signals EU0 to EU2. Main bit lines UMBL3 to UMBL63 are electrically coupled to sense amplifier SA according to L-level control signals EU3 to EU63.

Hereinafter, driver unit group 30 will be considered.

When column address CA0 is "0" (i.e., "L" level), read control circuit RDD outputs "H" level as control signal ED0. Since driver unit group 30 has the same structure as that of driver unit group 35, each driver unit DRD outputs a control signal to the subsequent stage according to a control signal ED of the previous stage and the column selection result received from a corresponding NOR circuit. In driver unit group 30, driver unit DRD1 receives the column selection result ("H" level) as described above. Accordingly, driver unit DRD0 outputs "H" level as control signal ED1, and driver unit DRD1 outputs "L" level as control signal ED2 according to the column selection result ("H" level). Similarly, each of the following driver units DRD outputs "L" level as a control signal ED3 to ED63.

Accordingly, main bit lines LMBL0, LMBL1 are electrically coupled to ground voltage GND according to H-level control signals ED0, ED1. Main bit lines LMBL2 to LMBL63 are electrically coupled to sense amplifier SA according to L-level control signals ED2 to ED63.

As a result, main bit lines UMBL0, UMBL1 and main bit lines LMBL0, LMBL1 corresponding thereto are electrically coupled to ground voltage GND, and main bit line UMBL2 and main bit line LMBL2 corresponding thereto are electrically coupled to ground voltage GND and sense amplifier SA, respectively. Main bit lines UMBL3 to UMBL63 and main bit lines LMBL3 to LMBL63 corresponding thereto are electrically coupled to sense amplifier SA.

When sub column decoder 60 selects gate selection lines SU, SD as described above, column gate unit CGU2 electrically couples sub bit lines SBL16 to SBL19 located on one side (left side) of the memory cell column between sub bit lines SBL19, SBL20 to main bit line UMBL2 connected to ground voltage GND. On the other hand, column gate unit CGD2 electrically couples sub bit lines SBL20 to SBL23 located on the other side (right side) of the memory cell column to main bit line LMBL2 connected to sense amplifier SA.

At time t2, a selected word line is activated. It is herein assumed that word line WL256 is activated.

As a result, data is read from bit 2 on the left side of a corresponding memory cell in the memory cell column located between sub bit lines SBL19, SBL20.

Regarding the other sub bit lines SBL (e.g., sub bit lines SBL0 to SBL15), corresponding main bit lines UMBL0, UMBL1, LMBL0, LMBL1 are electrically coupled to ground voltage GND. Therefore, sub bit lines SBL0 to SBL15 are set to the same voltage level as that of sub bit lines SBL16 to SBL19. Similarly, regarding a sub bit line SBL24 and the following sub bit lines, corresponding main bit lines UMBL, LMBL are electrically coupled to sense amplifier SA. Therefore, these sub bit lines are set to the same voltage level as that of sub bit lines SBL20 to SBL23.

With the above structure, data is read from a selected memory cell in a selected memory cell column, and a first sub bit line group located on one side of the selected memory cell column is set to the same voltage level. Moreover, a second sub bit line group located on the other side of the selected memory cell column is set to the same voltage level which is complementary to the voltage level of the first sub bit line group. This suppresses generation of a through current during read operation even when the memory array structure in which each sub bit line SBL is shared by adjacent two memory cell columns is employed. As a result, the time required for the through current to disappear, that is, delay time in read operation, can be eliminated, enabling high-speed read operation.

Although the above description is given for row memory block RBK4, the same applies to the other row memory blocks RBK.

Moreover, in the illustrated example, memory array 11 has row memory blocks RBK0 to RBK7 arranged in the column direction. However, a plurality of memory arrays having this structure may be arranged in the row direction. In this case, adjacent two memory arrays may be electrically separated (insulated) from each other, and the above configuration may be applied.

(Second Embodiment)

Figure 12:
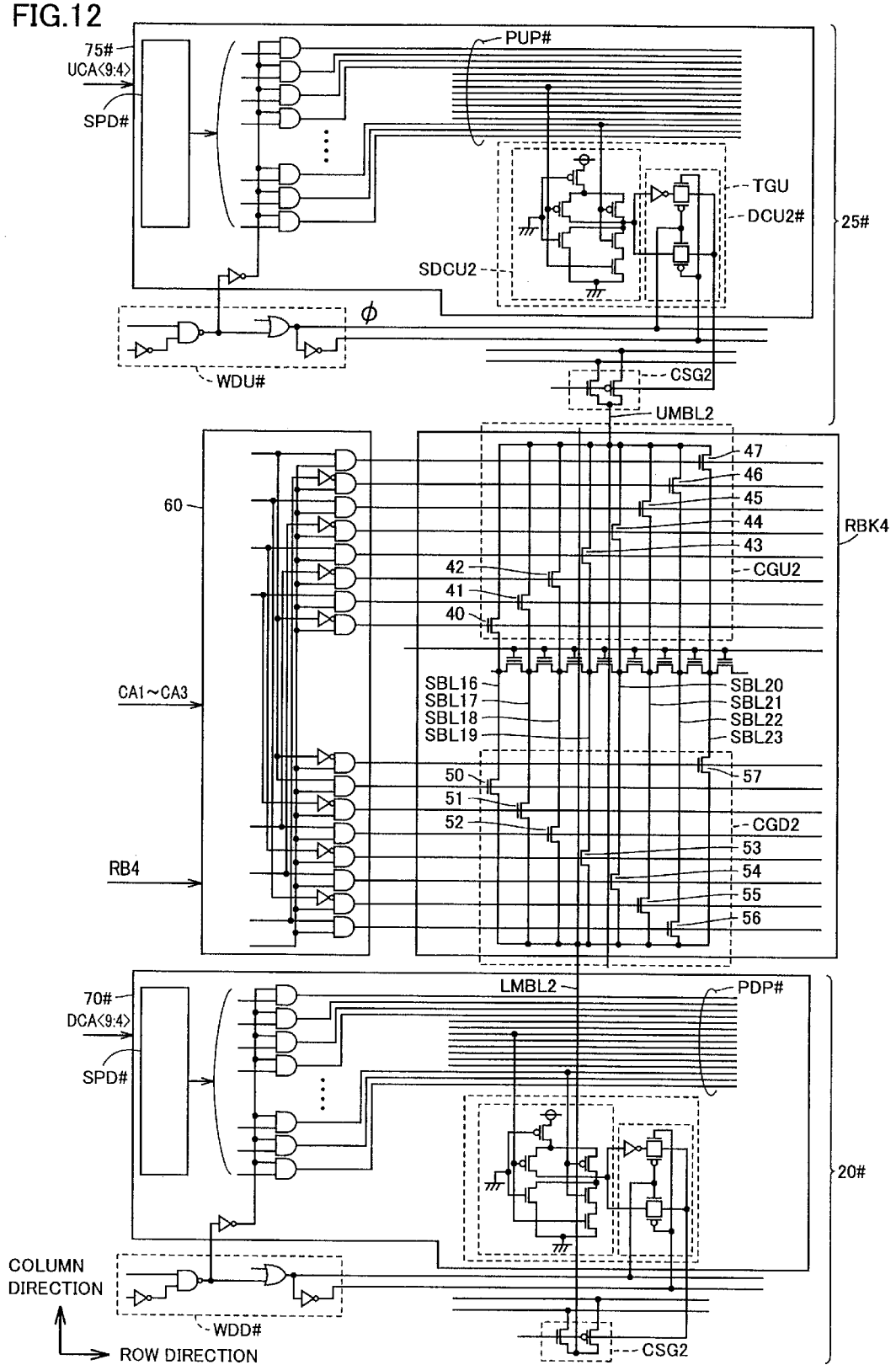
FIG. 12 shows the structure of column selection circuitry according to a second embodiment of the present invention.

Column selection circuitry of the second embodiment shown in FIG. 12 is intended to select a column at a higher speed than that of the column selection circuitry of the first embodiment.

Referring to FIG. 12, the column selection circuitry of the second embodiment is different from the column selection circuitry of the first embodiment in that column decoders 20, 25 are replaced with column decoders 20#, 25#.

Figure 13:
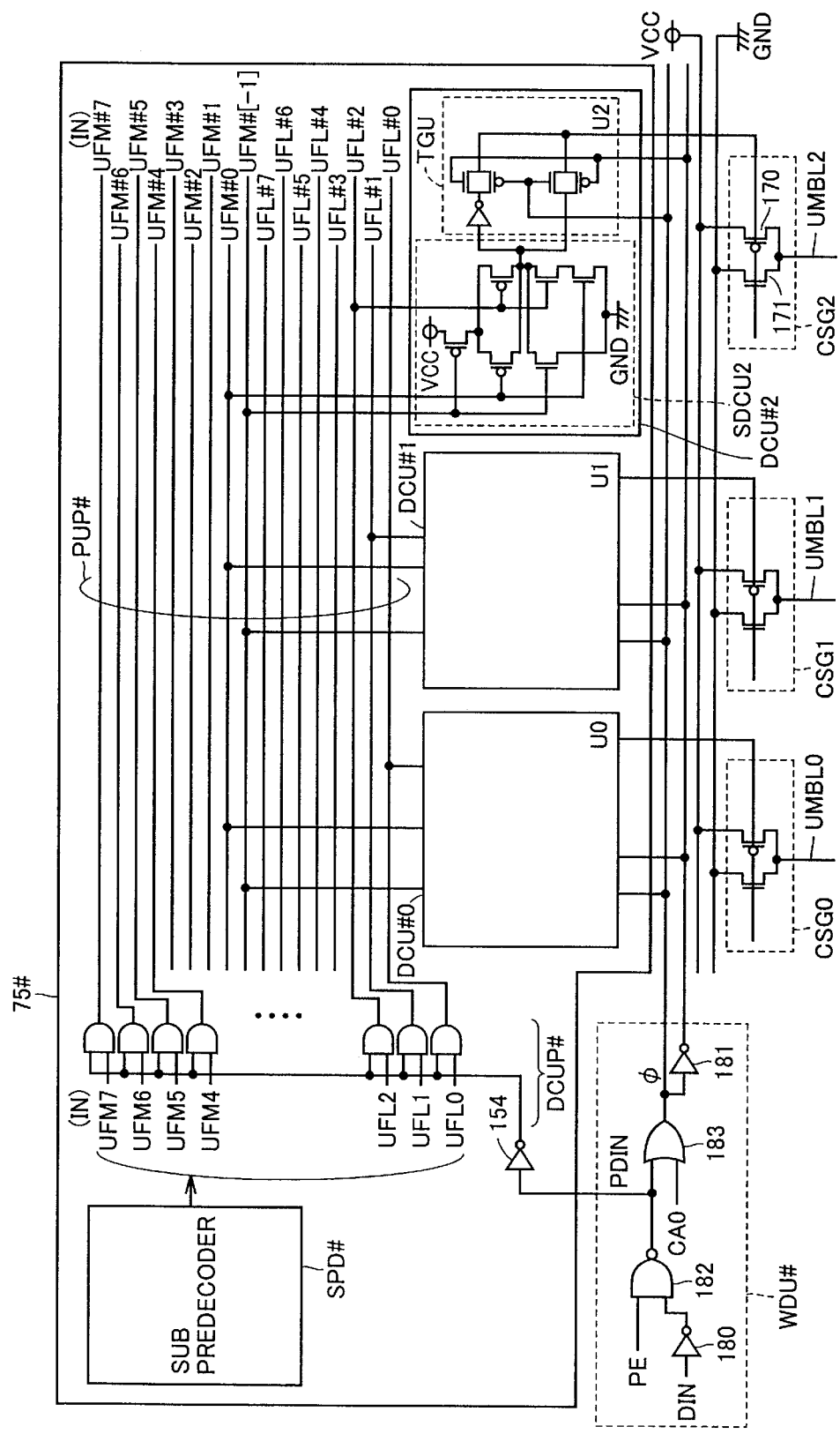
FIG. 13 shows the circuit structure of a column decoder 25# according to the second embodiment.

Referring to FIG. 13, column decoder 25# of the second embodiment includes a predecoder 75#, a write control circuit WDU#, and selection gates CSG provided corresponding to main bit lines UMBL. Selection gates CSG generally refer to individual selection gates.

FIG. 13 exemplarily shows selection gates CSG0 to CSG2 corresponding to main bit lines UMBL0 to UMBL2.

Hereinafter, selection gate CSG2 will be described.

Selection gate CSG2 includes transistors 170, 171. For example, transistor 170 is provided between main bit line UMBL2 and power supply voltage VCC, and transistor 171 is connected between main bit line UMBL2 and ground voltage GND. Each of transistors 170, 171 receives the decode result of predecoder 75# at its gate, and electrically couples main bit line UMBL2 to either power supply voltage VCC or ground voltage GND. The other selection gates CSG have the same structure as that of selection gate CSG2, and each selection gate CSG receives the decode result of predecoder 75#.

Predecoder 75# includes a sub predecoder SPD# for receiving an applied address and generating predecode signals UFL0 to UFL7, UFM(-1) to UFM7, a decode unit group DCUP# for outputting the generated predecode signals to a decode line group PUP#, and decode units DCU# provided corresponding to main bit lines UMBL. Each decode unit DCU# is connected to prescribed decode lines of decode line group PUP# and outputs the decode result to a corresponding selection gate CSG.

FIG. 14 is a decode table of predecode signals UFL0 to UFL7 generated based on internal address UCA<63> applied to sub predecoder SPD# of predecoder 75#. The same applies to predecode signals DFL0 to DFL7 generated based on internal address DCA<63> applied to sub predecoder SPD# of predecoder 70#.

FIG. 15 is a decode table of predecode signals UFM(-1) to UFM7 generated based on internal address UCA<9:7> applied to sub predecoder SPD# of predecoder 75#. The same applies to predecode signals DFM(-1) to DFM7 generated based on internal address DCA<9:7> applied to sub predecoder SPD# of predecoder 70#.

Referring back to FIG. 13, decode unit group DCUP# receives an inverted signal of control signal PDIN through an inverter 154 and the predecode signals, and outputs the AND operation result of control signal PDIN and each of the predecode signals to a corresponding decode line of decode line group PUP#. More specifically, decode unit group DCUP# in predecoder 75# receives predecode signals UFL0 to UFL7, UFM(-1) to UFM7 and transmits predecode signals UFL#0 to UFL#7, UFM#(-1) to UFM#7 to decode line group PUP#. Similarly, decode unit group DCUP# in predecoder 70# receives predecode signals DFL0 to DFL7, DFM(-1) to DFM7 and transmits predecode signals DFL#0 to DFL#7, DFM#(-1) to DFM#7 to decode line group PDP#.

Write control circuit WDU# includes inverters 180, 181, a NAND circuit 182 and an OR circuit 183. NAND circuit 182 receives a write control signal PE and also receives an inverted signal of write data DIN through inverter 180, and outputs the NAND operation result of the received signals as control signal PDIN. OR circuit 183 receives control signal PDIN and column address CA0 and outputs the OR operation result of the received signals to each decode unit DCU# as a control signal φ. Control signal φ and an inverted signal thereof are applied to each decode unit DCU#.

Decode units DCU# generally refer to individual decode units. FIG. 13 exemplarily shows decode units DCU#0 to DCU#2 provided corresponding to main bit lines UMBL0 to UMBL2.

Hereinafter, the circuit structure of decode unit DCU#2 will be described.

Decode unit DCU#2 includes a sub decode unit SDCU2 and a transfer gate unit TGU. Transfer gate unit TGU outputs either an output signal of sub decode unit SDCU2 or an inverted signal thereof in response to control signal φ which is output from write control circuit WDU#. For example, when control signal φ is at "H" level, transfer gate unit TGU outputs the output signal of sub decode unit SDCU2 as an output signal of decode unit DCU#2. On the other hand, when control signal φ is at "L" level, transfer gate unit TGU outputs an inverted signal of the output signal of sub decode unit SDCU2 as an output signal of decode unit DCU#2.

Figure 16:
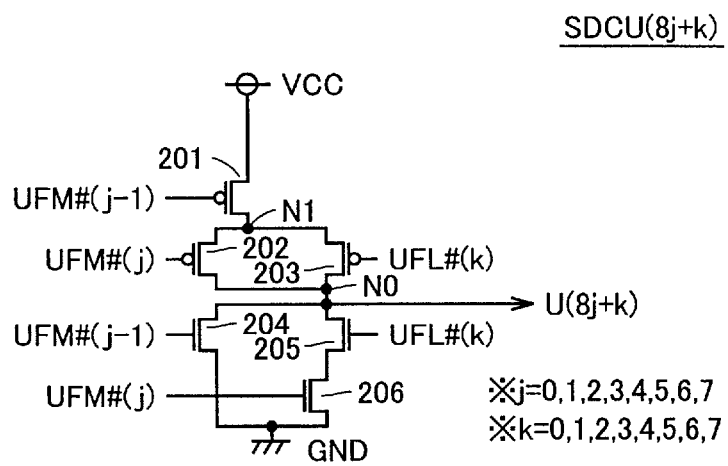
FIG. 16 shows the circuit structure of a sub decode unit SDCU(8j+k).

Referring to FIG. 16, sub decode unit SDCU(8j+k) includes transistors 201 to 206. Hereinafter, sub decode unit SDCU(8j+k) is sometimes generally referred to as sub decode unit SDCU.

Transistor 201 is provided between power supply voltage VCC and a node N1 and has its gate connected to a decode line corresponding to predecode signal UFM#(j−1). Transistor 202 is provided between nodes N1, N0 and has its gate connected to a decode line corresponding to predecode signal UFM#(j). Transistor 203 is provided between nodes N1, N0 and has its gate connected to a decode line corresponding to predecode signal UFL#(k). Transistor 204 is provided between ground voltage GND and node N0 and has its gate connected to a decode line corresponding to predecode signal UFM#(j−1). Transistors 205, 206 are provided between ground voltage GND and node N0. Transistor 206 has its gate connected to a decode line corresponding to predecode signal UFM#(j), and transistor 205 has its gate connected to a decode line corresponding to predecode signal UFL#(k). Decode signal U(8j+k) is generated from node N0.

For example, since j=0 and k=2 for sub decode unit SDCU2 corresponding to main bit line UMBL2, sub decode unit SDCU2 is electrically coupled to decode lines of decode line group PUP# corresponding to predecode signals UFM#0, UFM#(−1), UFL#2.

Predecoder 75# outputs the decode result to each of selection gates CSG corresponding to main bit lines UMBL in parallel according to an applied address. In other words, predecoder 75# generates decode signals U0 to U63 according to an applied address and applies the generated decode signals U0 to U63 to respective selection gates CSG0 to CSG63 in parallel.

Figure 17:
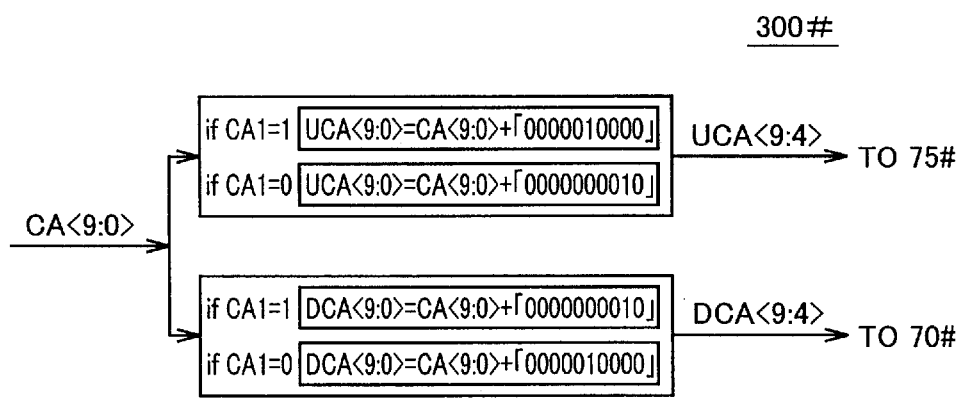
FIG. 17 is a conceptual diagram of an address converter 300# according to the second embodiment.

Referring to FIG. 17, an address converter 300# of the second embodiment receives column address CA<9:0> and outputs internal addresses to predecoders 70#, 75#. More specifically, when column address CA1 is "1", address converter 300# defines column address CA<9:0>+ "0000010000" as internal address UCA<9:0>, and defines column address CA<9:0>+"0000000010" as internal address DCA<9:0>. On the other hand, when column address CA1 is "0", address converter 300# defines column address CA<9:0>+"0000000010" as internal address UCA<9:0>, and defines column address CA<9:0>+ "0000010000" as internal address DCA<9:0>.

Figure 18:
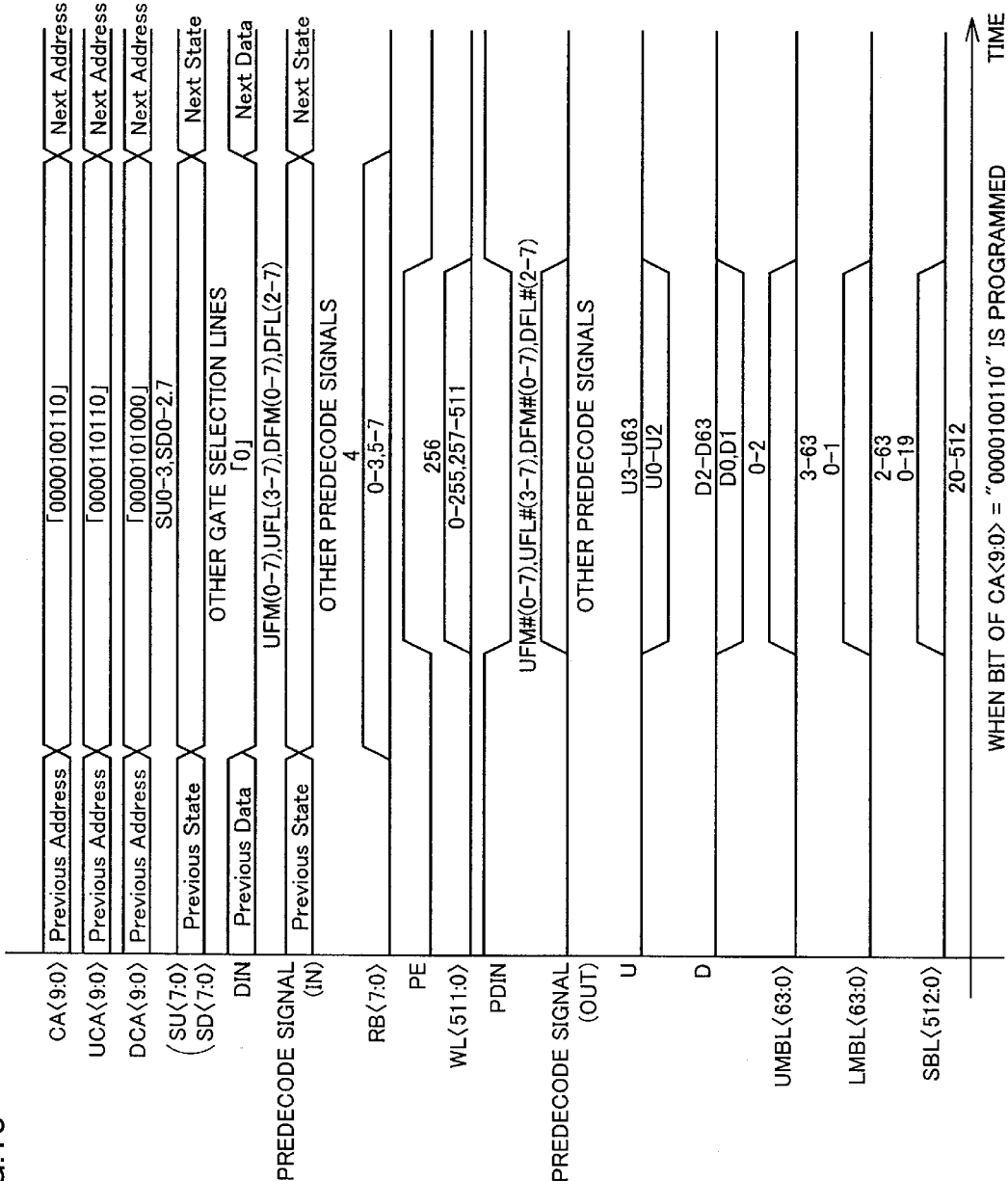
FIG. 18 is a timing chart illustrating write operation according to the second embodiment.
Figure 19:
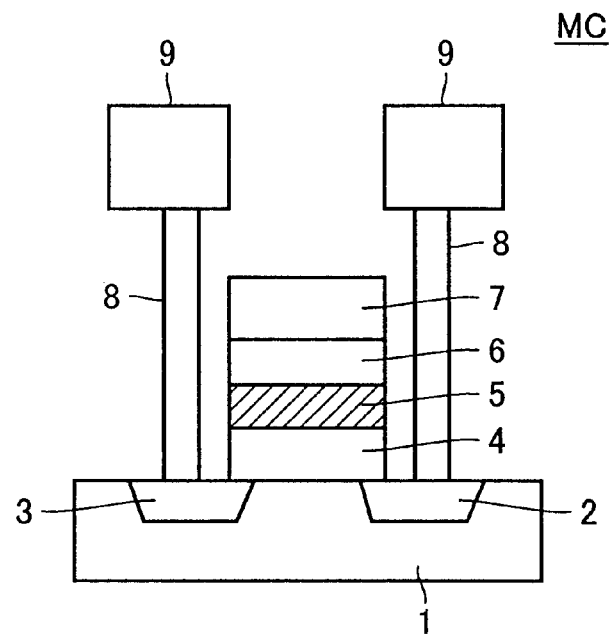
FIG. 19 is a cross-sectional view of a MONOS-type memory cell MC.
Figure 20:
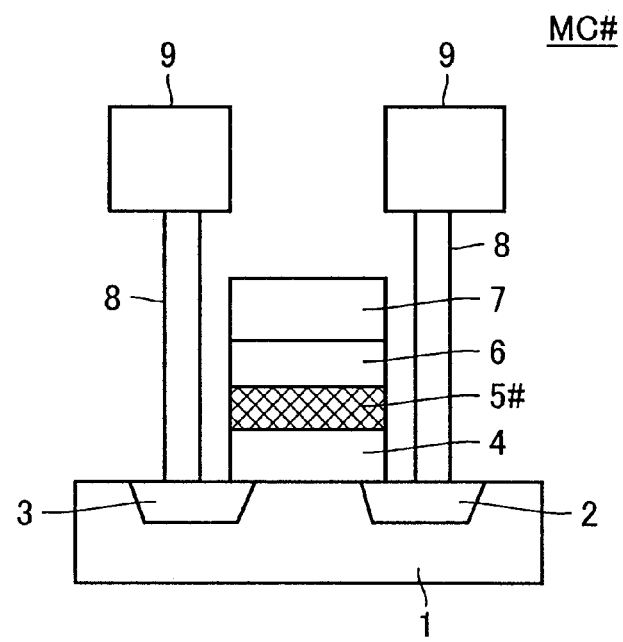
FIG. 20 is a cross-sectional view of another MONOS-type memory cell MC#.
Figure 22:
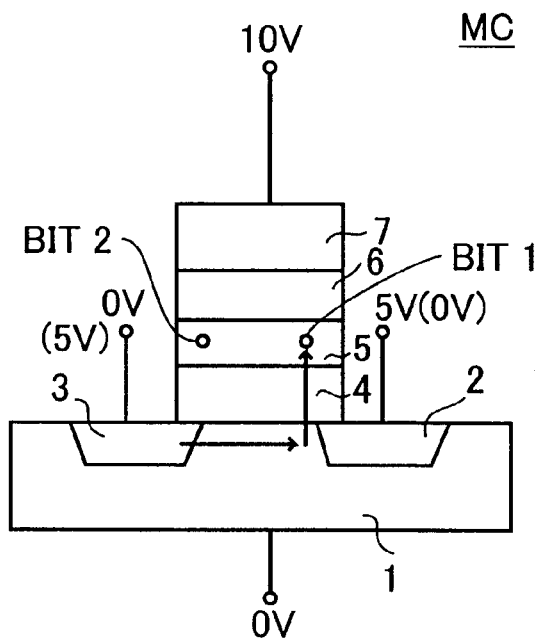
FIG. 22 illustrates write operation of a MONOS-type memory cell MC.
Figure 23:
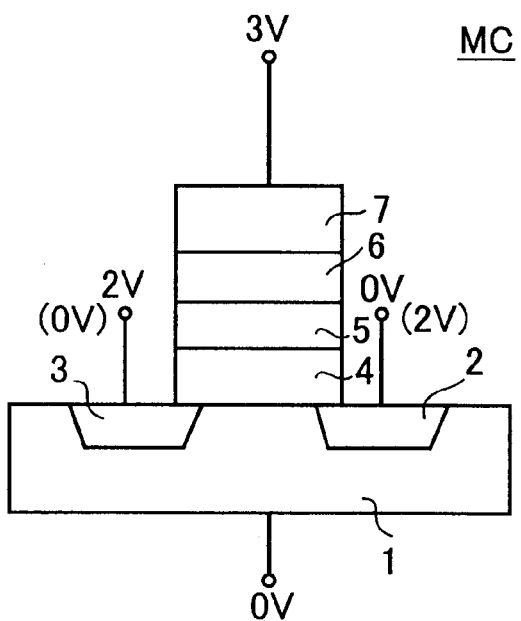
FIG. 23 illustrates read operation of a MONOS-type memory cell MC.
Figure 24:
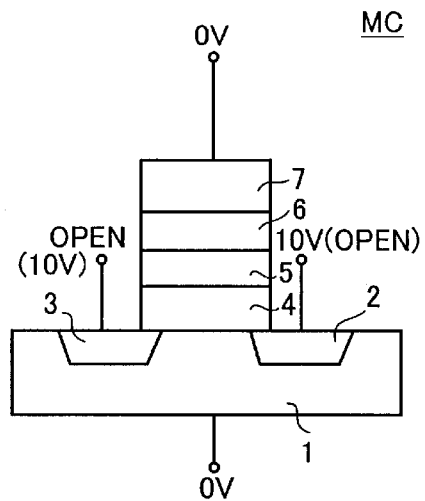
FIG. 24 illustrates erase operation of a MONOS-type memory cell MC.
Figure 25:
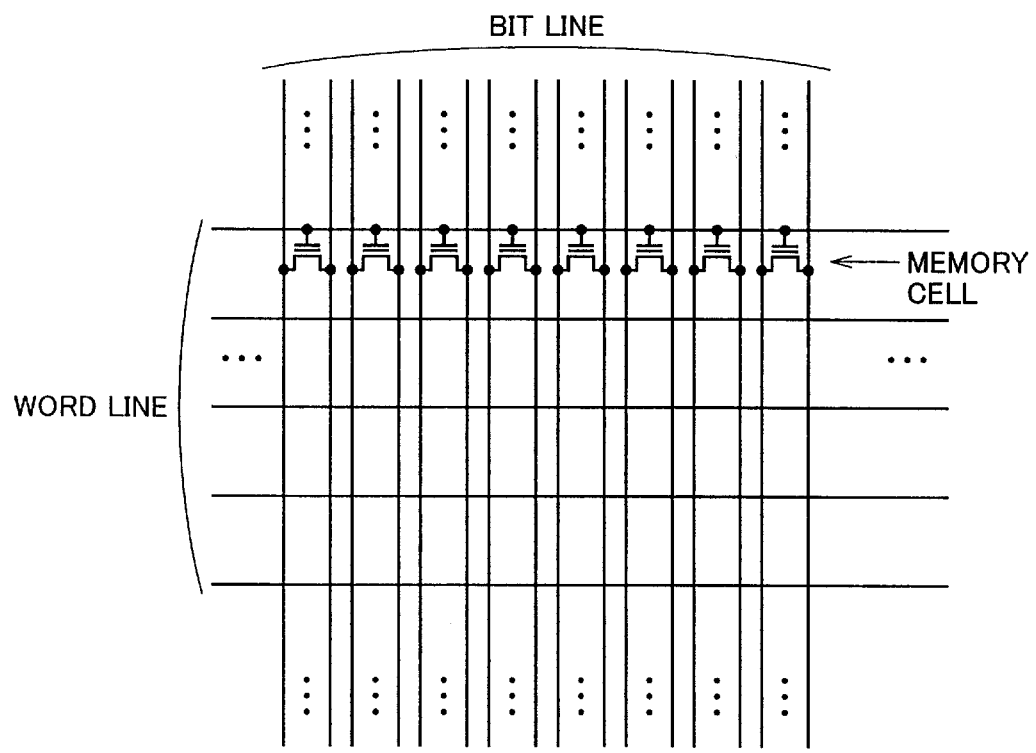
FIG. 25 shows an example of a memory array having MONOS-type memory cells MC arranged in a matrix.
Figure 26:
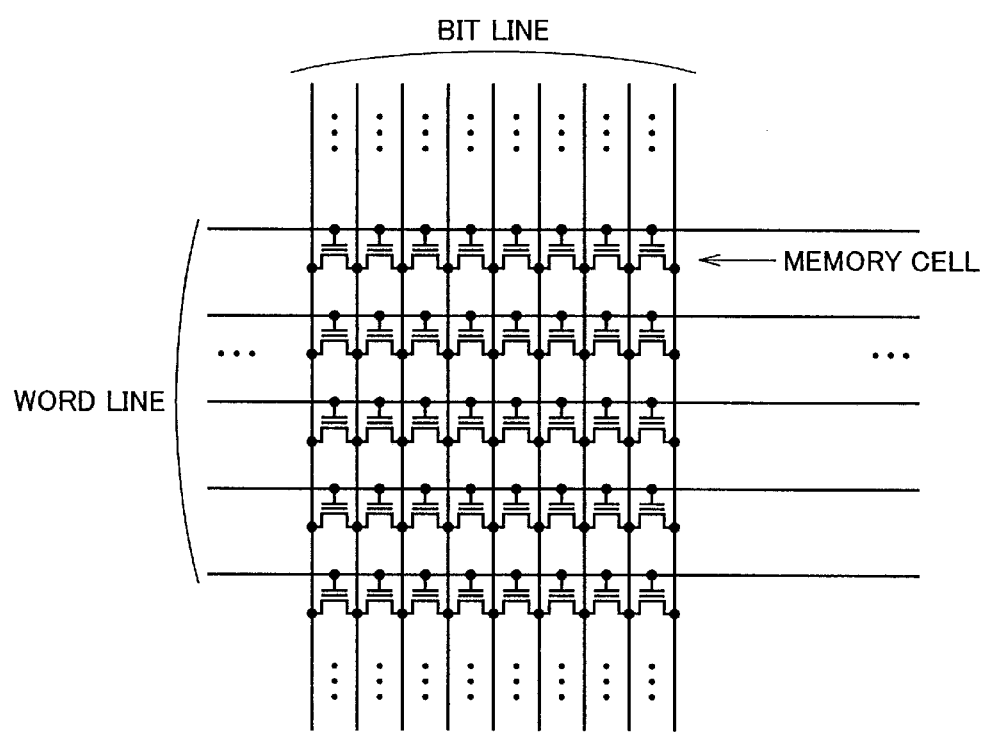
FIG. 26 shows an example of another memory array.
Figure 27:
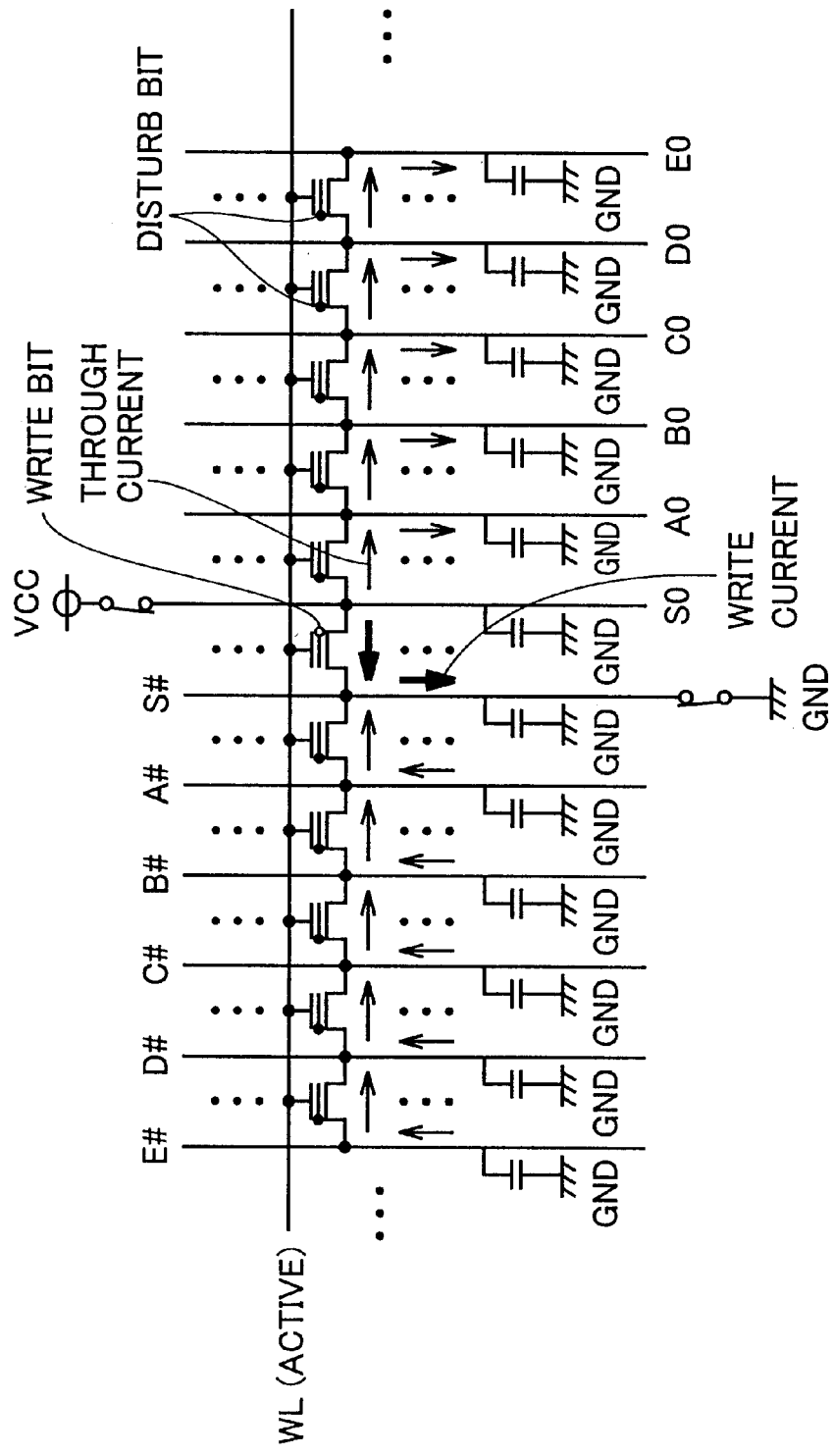
FIG. 27 is a conceptual diagram illustrating erroneous writing in write operation.
Figure 28:
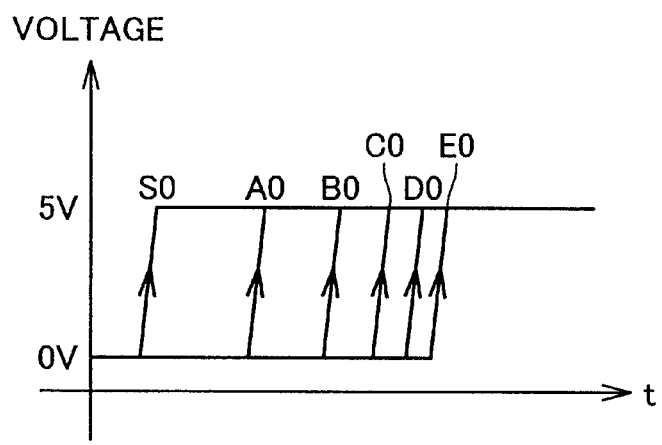
FIG. 28 shows the potential levels of bit lines A0 to E0 in the case where a bit line S0 is connected to a power supply voltage VCC in write operation.
Figure 29:
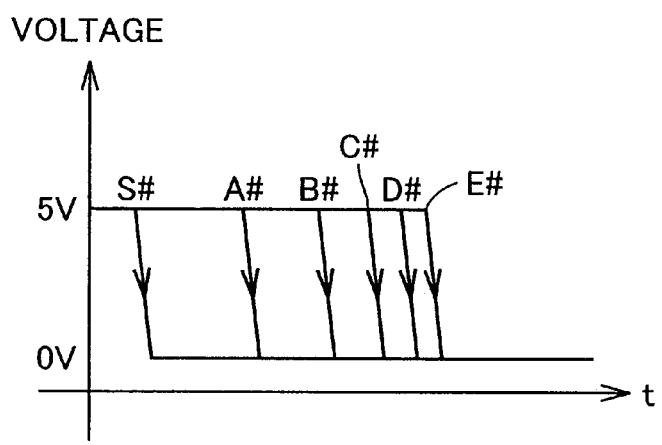
FIG. 29 shows the potential levels of bit lines A# to E# in the case where a bit line S# is connected to a ground voltage GND in write operation.
Figure 30:
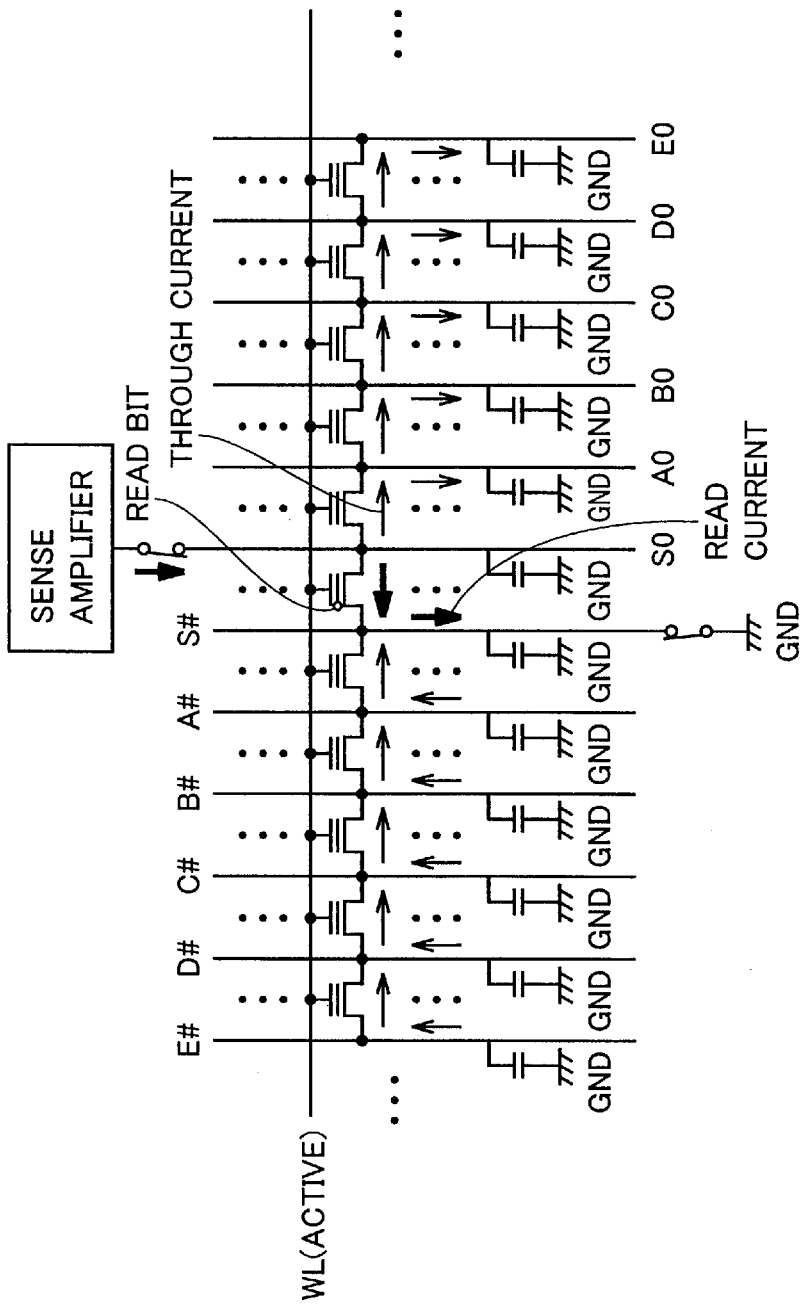
FIG. 30 is a conceptual diagram illustrating a through current that flows through non-selected memory cells in read operation.
Figure 31:
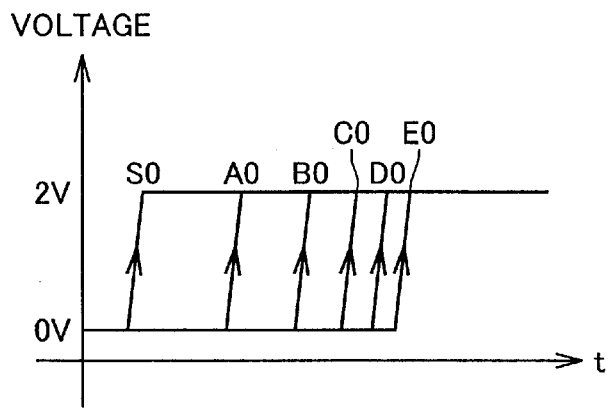
FIG. 31 shows the potential levels of bit lines A0 to E0 in the case where a bit line S0 is connected to a sense amplifier (2 V) in read operation.
Figure 32:
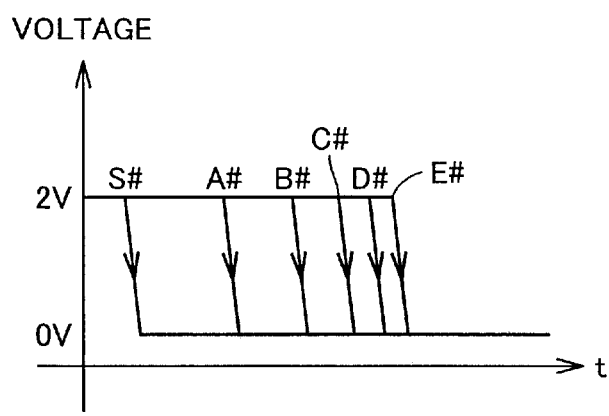
FIG. 32 shows the potential levels of bit lines A# to E# when a bit line S# is connected to ground voltage GND in read operation.
Figure 33:
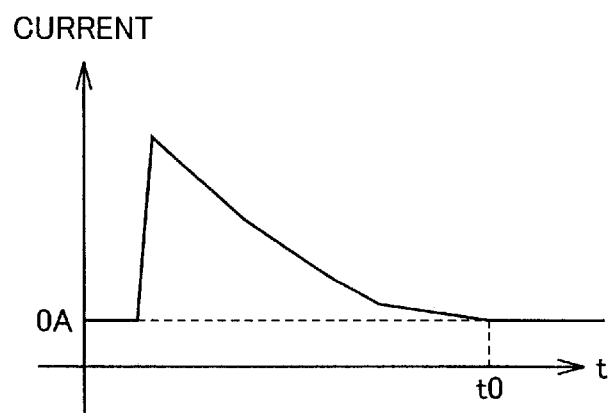
FIG. 33 is a timing chart of a through current that flows through the sense amplifier right after read operation is started.

Hereinafter, write operation will be described with reference to the timing chart of FIG. 18. In the illustrated example, data is to be written to bit 2 on the left side of the memory cell column which is located between sub bit lines SBL19, SBL20 electrically coupled to main bit lines UMBL2, LMBL2 corresponding to column address CA<9:0> of "0000100110".

Column address CA<9:0> is applied at time t1. Since column address CA1 is "1", address converter 300# defines column address CA<9:0>+"0000010000" as internal address UCA<9:0>. In other words, internal address UCA<9:0> is "0000110110". Moreover, address converter 300# defines column address CA<9:0>+"0000000010" as internal address DCA<9:0>. In other words, internal address DCA<9:0> is "0000010010".

Sub column decoder 60 activates gate selection lines SU0 to SU3, SD0 to SD2, SD7 to "H" level according to the applied column address CA<3:1> and row block control signal RB4 ("H" level). The other gate selection lines SU, SD are at "L" level.

Internal addresses UCA<9:4>, DCA<9:4> are respectively applied from address converter 300# to predecoder 75# of column decoder 25# and predecoder 70# of column decoder 20#. Each of sub predecoders SPD# in predecoder 75#, 70# outputs the received internal address UCA, DCA as predecode signals. In the illustrated example, sub predecoder SPD# in predecoder 75# sets predecode signals UFL3 to UFL7 to "H" level according to internal address UCA<9:4>. Moreover, sub predecoder SPD# in predecoder 75# sets predecode signals UFM0 to UFM7 to "H" level. Similarly, sub predecoder SPD# in predecoder 70# sets predecode signals DFL2 to DFL7 to "H" level according to internal address DCA<9:4>. Moreover, sub predecoder SPD# in predecoder 70# sets predecode signals DFM0 to DFM7 to "H" level. The other predecode signals are set to "L" level.

At time t1, write data DIN is set to "L" level.

At time t2, write control signal PE at "H" level is applied to write control circuit WDU# and control signal PDIN is set to "L" level.

In response to control signal PDIN ("L" level), decode unit group DCUP# in predecoder 75# is activated and outputs predecode signals UFL#, UFM# to decode line group PUP#. Similarly, decode unit group DCUP in predecoder 70# outputs predecode signals DFL# DFM# to decode line group PDP#.

Accordingly, each decode unit DCU# in predecoder 75# generates a decode signal U based on the decode result. More specifically, decode units DCU#0 to DCU#63 generate "L" level as decode signals U0 to U2 and generate "H" level as decode signals U3 to U63 according to the decode tables of FIGS. 14, 15.

Similarly, each decode unit DCU# in predecoder 70# generates a decode signal D based on the decode result. More specifically, decode units DCU#0 to DCU#63 generate "L" level as decode signals D0, D1 and generate "H" level as decode signals D2 to D63 according to the decode tables of FIGS. 14, 15.

Since column address /CA0 is "1" (i.e., "H" level), write control circuit WDU# in column decoder 25# generates "H" level as control signal φ, that is, the OR operation result obtained by OR circuit 183.

Decode signals U generated by decode units DCU# are output in response to control signal φ. In the illustrated example, control signal φ is at "H" level. Therefore, decode signals U generated by decode units DCU# are directly applied to respective selection gates CSG.

In other words, decode signals U0 to U2 generated by decode units DCU#0 to DCU#2 are at "L" level, and decode signals U3 to U63 generated by decode units DCU#3 to DCU#63 are at "H" level. Accordingly, selection gates CSG0 to CSG2 electrically couple main bit lines UMBL0 to UMBL2 to power supply voltage VCC according to decode signals U0 to U2. Selection gates CSG3 to CSG63 electrically couple main bit lines UMBL3 to UMBL63 to ground voltage GND according to decode signals U3 to U63.

On the other hand, decode signals D0, D1 generated by decode units DCU#0, DCU#1 of predecoder 70# are at "L" level, and decode signals D2 to D63 generated by decode units DCU#2 to DCU#63 are at "H" level.

Accordingly, selection gates CSG0, CSG1 electrically couple main bit lines LMBL0, LMBL1 to power supply voltage VCC according to decode signals D0, D1. Selection gates CSG2 to CSG63 electrically couple main bit lines LMBL2 to LMBL63 to ground voltage GND according to decode signals D2 to D63.

As a result, main bit lines UMBL0, UMBL1 and main bit lines LMBL0, LMBL1 corresponding thereto are electrically coupled to power supply voltage VCC, and main bit line UMBL2 and main bit line LMBL2 corresponding thereto are electrically coupled to power supply voltage VCC and ground voltage GND, respectively. Main bit lines UMBL3 to UMBL63 and main bit lines LMBL3 to LMBL63 corresponding thereto are electrically coupled to ground voltage GND.

When sub column decoder 60 selects gate selection lines SU, SD as described above, column gate unit CGU2 electrically couples sub bit lines SBL16 to SBL19 located on one side (left side) of the memory cell column between sub bit lines SBL19, SBL20 to main bit line UMBL2 connected to power supply voltage VCC. On the other hand, column gate unit CGD2 electrically couples sub bit lines SBL20 to SBL23 located on the other side (right side) of the memory cell column to main bit line LMBL2 connected to ground voltage GND.

At time t2, a selected word line is activated. It is herein assumed that a word line WL256 is activated.

As a result, data is written to bit 2 on the left side of a corresponding memory cell in the memory cell column located between sub bit lines SBL19, SBL20.

Regarding the other sub bit lines SBL (e.g., sub bit lines SBL0 to SBL15), corresponding main bit lines UMBL0, UMBL1, LMBL0, LMBL1 are electrically coupled to power supply voltage VCC. Therefore, sub bit lines SBL0 to SBL15 are set to the same voltage level as that of sub bit lines SBL16 to SBL19. Similarly, regarding a sub bit line SBL24 and the following sub bit lines, corresponding main bit lines UMBL, LMBL are electrically coupled to ground voltage GND. Therefore, these sub bit lines are set to the same voltage level as that of sub bit lines SBL20 to SBL23.

With the above structure, data is written to a selected memory cell in a selected memory cell column, and a first sub bit line group located on one side of the selected memory cell column is set to the same voltage level. Moreover, a second sub bit line group located on the other side of the selected memory cell column is set to the same voltage level which is complementary to the voltage level of the first sub bit line group. This suppresses generation of a through current during write operation even when the memory array structure in which each sub bit line SBL is shared by adjacent two memory cell columns is employed. As a result, erroneous writing, that is, "write disturb", can be prevented.

In the first embodiment, each driver unit operates based on a control signal, that is, the output result of a driver unit of the previous stage. According to the operation of each driver unit, each main bit line is electrically coupled to either power supply voltage VCC or ground voltage GND. This requires a prescribed time to complete selection of all main bit lines.

In the second embodiment, however, the decode result is output in parallel. Therefore, each main bit line can be electrically connected to either power supply voltage VCC or ground voltage GND in parallel. This enables improvement in column selection speed over the first embodiment, and thus enables implementation of high-speed write operation.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:
   a memory array having a plurality of memory cells arranged in rows and columns;
   a plurality of word lines provided corresponding to the memory cell rows and selectively activated; and
   a plurality of bit lines provided on opposite sides of each of the memory cell columns so as to extend in a column direction, each bit line being shared by adjacent two memory cell columns, wherein
   each of said memory cells of each of said memory cell rows is electrically coupled between adjacent two bit lines,
   said semiconductor memory device further comprising:
      a bit-line control section for controlling setting of a voltage of said plurality of bit lines in write operation and read operation, wherein
         said bit-line control section divides said plurality of bit lines into first and second groups based on a selected memory cell column, and sets the bit lines of said first group to one of first and second voltages and sets the bit lines of said second group to the other of said first and second voltages.

2. The semiconductor memory device according to claim 1, further comprising:
   first and second main bit lines, wherein
      said bit-line control section includes
         a first connection control section for controlling connection between said first main bit line and one end of each of said bit lines, and
         a second connection control section for controlling connection between said second main bit line and the other end of each of said bit lines,
      said bit-line control section electrically couples said first main bit line to one of said first and second voltages and electrically couples said second main bit line to the other of said first and second voltages in said write operation and read operation,
      said first connection control section electrically couples the bit lines of said first group to said first main bit line, and said second connection control section electrically couples the bit lines of said second group to said second main bit line.

3. The semiconductor memory device according to claim 2, further comprising:
a plurality of memory arrays arranged in a row direction, wherein
adjacent two memory arrays are electrically insulated from each other,
said semiconductor memory device further comprising:
said first and second main bit lines and said first and second connection control sections for every memory array, wherein
in said write operation and read operation, said bit-line control section electrically couples one of the first and second main bit lines corresponding to a selected memory array to one of said first and second voltages and electrically couples the other main bit line to the other of said first and second voltages.

4. The semiconductor memory device according to claim 1, wherein
said memory array is divided into a plurality of memory blocks along a row direction,
said semiconductor memory device further comprising:
a plurality of first and second main bit lines provided corresponding to said plurality of memory blocks, wherein
said bit-line control section includes
a plurality of first connection control sections provided corresponding to said plurality of memory blocks, and each controlling connection between the corresponding first main bit line and one end of each bit line in the corresponding memory block, and
a plurality of second connection control sections provided corresponding to said plurality of memory blocks, and each controlling connection between the corresponding second main bit line and the other end of each bit line in the corresponding memory block,
when two bit lines corresponding to said selected memory cell column are both included in a selected memory block,
said bit-line control section electrically couples one of said first and second main bit lines corresponding to said selected memory block to one of said first and second voltages and electrically couples the other main bit line to the other of said first and second voltages in said write operation and read operation,
the first connection control section corresponding to said selected memory block electrically couples the bit lines of said first group divided based on said selected memory cell column to the corresponding first main bit line, and
the second connection control section corresponding to said selected memory block electrically couples the bit lines of said second group divided based on said selected memory cell column to the corresponding second main bit line, and
when one of the two bit lines corresponding to said selected memory cell column is included in a selected memory block and the other of said two bit lines is included in an adjacent memory block,
said bit-line control section electrically couples the first and second main bit lines corresponding to said selected memory block to one of said first and second voltages and electrically couples the first and second main bit lines corresponding to said adjacent memory block to the other of said first and second voltages in said write operation and read operation,
the first and second connection control sections corresponding to said selected memory block electrically couple each bit line in said selected memory block to at least one of the corresponding first and second main bit lines, and
the first and second connection control sections corresponding to said adjacent memory block electrically couple each bit line in said adjacent memory block to at least one of the corresponding first and second main bit lines.

5. The semiconductor memory device according to claim 4, wherein
said bit-line control section divides said plurality of memory blocks into first and second memory block groups based on said selected memory block including said selected memory cell column, said first memory block group being formed by memory blocks other than said selected memory block which are located on one side of said selected memory block, and said second memory block group being formed by memory blocks other than said selected memory block which are located on the other side of said selected memory block,
each of the first and second main bit lines of said first memory block group is electrically coupled to one of said first and second voltages, and
each of the first and second main bit lines of said second main block group is electrically coupled to the other of said first and second voltages.

6. The semiconductor memory device according to claim 4, wherein
said bit-line control section further includes a plurality of voltage connection control sections provided corresponding to said plurality of memory blocks, each of said plurality of voltage connection control sections controlling connection between each of the corresponding first and second main bit lines and at least one of said first and second voltages, and
said plurality of voltage connection control sections electrically couple said corresponding first and second main bit lines to at least one of said first and second voltages in parallel in said write operation and read operation.

7. The semiconductor memory device according to claim 1, wherein said bit-line control section sets the bit lines of said first group to said first voltage and sets the bit lines of said second group to said second voltage in said write operation, and sets the bit lines of said first group to said second voltage and sets said bit lines of said second group to said first voltage in said read operation.

8. The semiconductor memory device according to claim 1, wherein
each memory cell in each memory cell row corresponds to a transistor cell capable of being set to a non-volatile threshold voltage, and
said transistor cell has its source and drain electrically coupled to said adjacent two bit lines, respectively, and has its gate electrically coupled to the corresponding word line.

9. The semiconductor memory device according to claim 8, wherein each of said adjacent two bit lines is formed in a layer located above said corresponding word line.

10. The semiconductor memory device according to claim 8, wherein said adjacent two bit lines are formed from a diffusion layer.

11. The semiconductor memory device according to claim 8, wherein said adjacent two bit lines are formed from a metal layer.

12. The semiconductor memory device according to claim 8, wherein each memory cell has a gate insulating film for trapping charges of one-bit data in each of two regions respectively corresponding to regions near said source and drain.

13. The semiconductor memory device according to claim 12, wherein said gate insulating film of each memory cell includes two insulating films, and a charge trapping film provided between said two insulating films, for trapping said charges.

14. The semiconductor memory device according to claim 13, wherein said charge trapping film is formed from a nitride film.

15. The semiconductor memory device according to claim 13, wherein said charge trapping film is formed from a silicon oxide film having a plurality of granular polysilicons.

* * * * *